(12) United States Patent
Kashima et al.

(10) Patent No.: US 9,728,677 B2
(45) Date of Patent: Aug. 8, 2017

(54) DEEP ULTRAVIOLET LED AND METHOD FOR MANUFACTURING THE SAME

(71) Applicants: MARUBUN CORPORATION, Tokyo (JP); TOSHIBA KIKAI KABUSHIKI KAISHA, Tokyo (JP); RIKEN, Wako-shi, Saitama (JP); ULVAC, INC., Chigasaki-shi, Kanagawa (JP); TOKYO OHKA KOGYO CO., LTD., Kawasaki-shi, Kanagawa (JP)

(72) Inventors: Yukio Kashima, Tokyo (JP); Eriko Matsuura, Tokyo (JP); Mitsunori Kokubo, Numazu (JP); Takaharu Tashiro, Numazu (JP); Takafumi Ookawa, Numazu (JP); Hideki Hirayama, Wako (JP); Ryuichiro Kamimura, Susono (JP); Yamato Osada, Susono (JP); Satoshi Shimatani, Kawasaki (JP)

(73) Assignees: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP); TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 14/426,328

(22) PCT Filed: Oct. 24, 2014

(86) PCT No.: PCT/JP2014/078308
§ 371 (c)(1),
(2) Date: Mar. 5, 2015

(87) PCT Pub. No.: WO2015/133000
PCT Pub. Date: Sep. 11, 2015

(65) Prior Publication Data
US 2016/0133785 A1    May 12, 2016

(30) Foreign Application Priority Data

Mar. 6, 2014  (JP) ................................ 2014-043388

(51) Int. Cl.
| H01L 33/10 | (2010.01) |
| H01L 33/00 | (2010.01) |
| H01L 33/06 | (2010.01) |
| H01L 33/32 | (2010.01) |
| H01L 33/40 | (2010.01) |

(52) U.S. Cl.
CPC .......... H01L 33/10 (2013.01); H01L 33/0025 (2013.01); H01L 33/0075 (2013.01);
(Continued)

(58) Field of Classification Search
CPC .............................................. H01L 2933/0083
See application file for complete search history.

(56) References Cited

U.S. PATENT DOCUMENTS 5,337,328 A    8/1994  Lang et al.
5,955,749 A *  9/1999  Joannopoulos ........ B82Y 20/00
                                              257/432
(Continued)

FOREIGN PATENT DOCUMENTS

DE    102009057780    6/2011
EP        1526583     4/2005
(Continued)

OTHER PUBLICATIONS

International search report for International application No. PCT/JP2015/071453, dated Sep. 29, 2015 (8 pages).
(Continued)

*Primary Examiner* — Earl Taylor
(74) *Attorney, Agent, or Firm* — Hamre, Schumann, Mueller & Larson, P.C.

(57) ABSTRACT

A deep ultraviolet LED with a design wavelength of λ is provided that includes a reflecting electrode layer, a metal layer, a p-type GaN contact layer, and a p-type AlGaN layer that are sequentially stacked from a side opposite to a substrate, the p-type AlGaN layer being transparent to light with the wavelength of $\lambda$; and a photonic crystal periodic structure that penetrates at least the p-type GaN contact layer and the p-type AlGaN layer. The photonic crystal periodic structure has a photonic band gap.

8 Claims, 16 Drawing Sheets

(52) U.S. Cl.
CPC ............. *H01L 33/06* (2013.01); *H01L 33/32* (2013.01); *H01L 33/405* (2013.01)

(56) References Cited

U.S. PATENT DOCUMENTS

| | | | | |
|---|---|---|---|---|
| 7,520,742 | B2* | 4/2009 | Motowaki | B29C 33/58 |
| | | | | 106/38.27 |
| 8,405,103 | B2 | 3/2013 | Lee et al. | |
| 8,419,995 | B2* | 4/2013 | Yoneda | B29C 37/0003 |
| | | | | 264/293 |
| 8,703,837 | B2* | 4/2014 | Kawaguchi | B82Y 10/00 |
| | | | | 264/293 |
| 9,005,502 | B2* | 4/2015 | Chiba | B29C 33/40 |
| | | | | 264/220 |
| 9,073,102 | B2* | 7/2015 | Yoshida | B29C 33/62 |
| 9,263,649 | B2* | 2/2016 | Koike | G03F 7/0002 |
| 2002/0167013 | A1* | 11/2002 | Iwasaki | B82Y 20/00 |
| | | | | 257/79 |
| 2004/0016936 | A1 | 1/2004 | Tanaka et al. | |
| 2004/0113166 | A1 | 6/2004 | Tadatomo et al. | |
| 2004/0114652 | A1 | 6/2004 | Yoshikawa | |
| 2004/0206962 | A1 | 10/2004 | Erchak et al. | |
| 2004/0252509 | A1 | 12/2004 | Lin | |
| 2004/0264903 | A1 | 12/2004 | Dridi et al. | |
| 2006/0043400 | A1* | 3/2006 | Erchak | H01L 33/20 |
| | | | | 257/98 |
| 2006/0255341 | A1* | 11/2006 | Pinnington | B82Y 20/00 |
| | | | | 257/79 |
| 2006/0284187 | A1 | 12/2006 | Wierer, Jr. et al. | |
| 2007/0081253 | A1 | 4/2007 | Yamauchi | |
| 2007/0177644 | A1 | 8/2007 | Corzine | |
| 2007/0257269 | A1 | 11/2007 | Cho et al. | |
| 2008/0024053 | A1 | 1/2008 | Fujimoto et al. | |
| 2008/0061304 | A1 | 3/2008 | Huang et al. | |
| 2008/0258160 | A1* | 10/2008 | Do | H01L 33/508 |
| | | | | 257/98 |
| 2009/0134425 | A1 | 5/2009 | Nagai | |
| 2009/0184334 | A1 | 7/2009 | Lee et al. | |
| 2010/0072501 | A1 | 3/2010 | Wakai et al. | |
| 2010/0140643 | A1 | 6/2010 | Cho et al. | |
| 2010/0237372 | A1 | 9/2010 | Kim et al. | |
| 2011/0068676 | A1 | 3/2011 | Jeon et al. | |
| 2011/0309326 | A1 | 12/2011 | Gaska et al. | |
| 2012/0027038 | A1* | 2/2012 | Noda | H01S 5/105 |
| | | | | 372/45.01 |
| 2012/0112165 | A1 | 5/2012 | Charlton et al. | |
| 2012/0224147 | A1 | 9/2012 | Tomiyama et al. | |
| 2012/0228653 | A1 | 9/2012 | Ishida et al. | |
| 2012/0261642 | A1 | 10/2012 | Bergenek et al. | |
| 2013/0009167 | A1 | 1/2013 | Tan et al. | |
| 2013/0037820 | A1 | 2/2013 | Tsukihara et al. | |
| 2013/0043500 | A1 | 2/2013 | Orita | |
| 2013/0069034 | A1 | 3/2013 | Hirayama | |
| 2013/0146916 | A1 | 6/2013 | Yamamoto et al. | |
| 2013/0222770 | A1 | 8/2013 | Tomiyama | |
| 2013/0320301 | A1* | 12/2013 | Seo | H01L 33/10 |
| | | | | 257/13 |
| 2013/0328013 | A1 | 12/2013 | Inazu et al. | |
| 2014/0057377 | A1 | 2/2014 | Kamimura et al. | |
| 2014/0084317 | A1* | 3/2014 | Lee | H01L 33/58 |
| | | | | 257/98 |
| 2014/0151733 | A1* | 6/2014 | Koike | G03F 7/0002 |
| | | | | 257/98 |
| 2014/0167066 | A1* | 6/2014 | Kashima | H01L 33/20 |
| | | | | 257/76 |
| 2015/0044417 | A1* | 2/2015 | Koike | B29C 59/022 |
| | | | | 428/137 |
| 2015/0214448 | A1 | 7/2015 | Lee et al. | |
| 2016/0042102 | A1 | 2/2016 | Kashima et al. | |
| 2016/0133785 | A1 | 5/2016 | Kashima et al. | |

FOREIGN PATENT DOCUMENTS

| | | | | |
|---|---|---|---|---|
| EP | 1526583 | A2 * | 4/2005 | ............ B82Y 20/00 |
| JP | 2010074090 | | 4/2001 | |
| JP | 2002305328 | | 10/2002 | |
| JP | 2007109689 | | 4/2004 | |
| JP | 2004200209 | | 7/2004 | |
| JP | 2005-012160 | | 1/2005 | |
| JP | 2006196658 | | 7/2006 | |
| JP | 2006276388 | | 10/2006 | |
| JP | 2006523953 | | 10/2006 | |
| JP | 2007036186 | | 2/2007 | |
| JP | 2007294789 | | 11/2007 | |
| JP | 2007305998 | | 11/2007 | |
| JP | 2008-030235 | | 2/2008 | |
| JP | 2008053425 | | 3/2008 | |
| JP | 2008098526 | | 4/2008 | |
| JP | 2008-117922 | | 5/2008 | |
| JP | 2008117922 | | 5/2008 | |
| JP | 2008-538658 | | 10/2008 | |
| JP | 2008311317 | | 12/2008 | |
| JP | 2009033180 | | 2/2009 | |
| JP | 4329374 | | 9/2009 | |
| JP | 2009267263 | | 11/2009 | |
| JP | WO 2009148138 | A1 * | 12/2009 | ........... B29C 33/424 |
| JP | 4610863 | | 1/2010 | |
| JP | 2010074008 | | 4/2010 | |
| JP | 2010135798 | | 6/2010 | |
| JP | 200981469 | | 10/2010 | |
| JP | 2011086853 | | 4/2011 | |
| JP | 2011228513 | | 11/2011 | |
| JP | 2012186414 | | 9/2012 | |
| JP | 2013-009002 | | 1/2013 | |
| JP | KR 20130055015 | A * | 5/2013 | ........... G03F 7/0002 |
| JP | 2013120829 | | 6/2013 | |
| JP | 2013530537 | | 7/2013 | |
| JP | WO 2013137176 | A1 * | 9/2013 | ............ B29C 33/38 |
| JP | 5315513 | | 10/2013 | |
| JP | EP 2690650 | A1 * | 1/2014 | ............ G03F 7/0002 |
| JP | 2014068010 | | 4/2014 | |
| JP | KR 20140133607 | A * | 11/2014 | ............ B29C 33/38 |
| JP | EP 2827361 | A1 * | 1/2015 | ............ B29C 33/38 |
| JP | 2015041763 | | 3/2015 | |
| JP | EP 2827361 | A4 * | 4/2015 | ............ B29C 33/38 |
| JP | 5757512 | | 7/2015 | |
| JP | WO 2015133000 | A1 * | 9/2015 | ............ H01L 33/10 |
| JP | 2015195388 | | 11/2015 | |
| JP | EP 2942818 | A1 * | 11/2015 | ............ H01L 33/10 |
| KR | 20090001903 | | 1/2009 | |
| KR | 20110131212 | | 12/2011 | |
| KR | 20120117892 | | 10/2012 | |
| WO | WO 2008041161 | A2 * | 4/2008 | ............ H01L 33/24 |
| WO | 2011049018 | | 4/2011 | |
| WO | 2011104969 | | 9/2011 | |
| WO | 2012067080 | | 5/2012 | |
| WO | 2012/127660 | | 9/2012 | |
| WO | 2013008556 | | 1/2013 | |
| WO | 2013530537 | | 7/2013 | |
| WO | 2013132993 | | 9/2013 | |
| WO | 2015008776 | | 1/2015 | |

OTHER PUBLICATIONS

Hirayama et al.: "Recent progress and future prospects of ALgaN-based high-efficiency deep-ultraviolet light-emitting diodes"; Japanese Journal of Applied Physics, vol. 53, 2014, pp. 1-10.

Shinji Matsui: "Current Nano-imprint processing technologies"; Monthly Display, 2005, vol. 11, No. 5, pp. 82-89.

(56) References Cited

OTHER PUBLICATIONS

Nakamatsu et al.: "Bilayer Resist Method for Room-Temperature Nanoimprint Lithography"; Japanese Journal of Applied Physics, 2004, vol. 43, No. 6B, pp. 4050-4053.
Korean Office Action for Korean application No. 2015-7005308, dated Oct. 21, 2015 (6 pages).
Extended European Search Report issued in the corresponding European Patent Application No. 14841324.8 dated Oct. 23, 2015 (6 pages).
T. Nakashima et al. "Improvement of the light extraction efficiency in 350-nm-emission UV-LED," Proceedings of the [[6]]60$^{th}$ Lecture Presentation in Spring of the Japan Society of Applied Physics, 2013, 29p-G21-10, 2 pages total (English translation provided).
CREST Research Area of the Strategic Basic Research Programs "Light/Photon Science and Technology toward Creation of New Function," Report of Termination of Research for Research Subject: "Research of 230-350nm Band in AlGaN-based Deep Ultraviolet High-Efficiency Light Emitting Device," Research period: Oct. 2007 to Mar. 2013, 53 pages total (Partial English translation provided).
Office Action issued Jun. 1, 2015 in corresponding Korean patent application, 6 pages total.
Japan Society for the Promotion of Science: "Wiede-gap semiconductor/electronic device, No. 162 committee"; The 74th Workshop Document: Development of DUVLED by UV Craftory, Co., Ltd., dated Apr. 22, 2011.
Xie et al.: "Optimization design and fabrication of photonic crystal waveguides based on SOI using 248nm deep UV lithography," Proceedings of SPIE, 2004, vol. 5280, pp. 798-804.
Gourley et al.: "Optical properties of two-dimensional photonic lattices fabricated as honeycomb nanostructures in compound semiconductors," Applied Physics Letters, 1994, vol. 64, No. 6, pp. 687-689.
Delbeke et al.: "Rigorous electromagnetic analysis of dipole in periodically corrugated layers: the grating-assisted resonant-cavity light-emitting diode." J. Opt. Soc. AM. A, 2002, vol. 64, No. 19, No. 5, pp. 871-880.
Japanese Office Action for corresponding Japanese Application No. 2015-559356, issued Apr. 26, 2016. (5 pages).
International Search Report issued in corresponding Japanese Application No. PCT/JP2015/084461 dated Jan. 12, 2016 (10 pages).
Choi et al: "Design of an LED Chip Structure with an Integrated Two-dimensional Photonic Crystal to Enhance the light-extraction Efficiency"; Journal of Korean Physical Society, 2014, vol. 94, No. 10, pp. 1425-1429.
Lai et al.: "Directional light extraction enhancement from GaN-based film-transferred photonic crystal light-emitting lodes"; Applied Physics Letters, 2009, vol. 64, pp. 123106-1 to 123106-3 (4 pages).
Orita et al.: "High-Extraction-Efficiency blue Light-Emitting Diode using Extended-Pitch Photonic Crystal"; 2004, vol. 13, No. 8B, pp. 5809-5813.
Ding et al: "Improving the Vertical light-Extraction Efficiency of GaN-Based Thin-Film Flip-Chip LED's With p-slide Deep-Hole Photonic Crystals"; Journal of Display Technology, 2014, vol. 10, No. 11, pp. 909-916.
Kashima et al.: "The micro machining process technology of nano imprint and dry etcing to improve the efficiency of notride LED"; IEICE Technical Report, 2014, vol. 114, No. 336, pp. 27-32.
International Search Report issued in International Application No. PCT/JP2016/075756 dated Nov. 8, 2016 (3 pages).
International Search Report issued in International Application No. PCT/JP2016/082397 dated Dec. 6, 2016 (3 pages).

* cited by examiner (a)

| | |
|---|---|
| 1 Al (or Au) Reflecting Electrode Layer | 8 Quantum Well Layer |
| 2 Ni (or Pd) Layer | 9 Barrier Layer |
| 3 p-GaN Contact Layer | 10 n-AlGaN Layer |
| 4 Transparent p-AlGaN Contact Layer | 11 AlN Buffer Layer |
| 5 p-AlGaN Layer | 12 Sapphire Substrate |
| 6 Electron Blocking Layer | 100 Photonic Crystal Periodic Structure |
| 7 Barrier Layer | 101 Circular Hole (Columnar Structure) |

(b)

1 Al (or Au) Reflecting Electrode Layer
2 Ni (or Pd) Layer
3 p-GaN Contact Layer
4 Transparent p-AlGaN Contact Layer
5 p-AlGaN Layer
6 Electron Blocking Layer
7 Barrier Layer
8 Quantum Well Layer
9 Barrier Layer
10 n-AlGaN Layer
11 AlN Buffer Layer
12 Sapphire Substrate
100a Photonic Crystal Periodic Structure
101a Circular Hole (Columnar Structure)

1 Al (or Au) Reflecting Electrode Layer
2 Ni (or Pd) Layer
3 p-GaN Contact Layer
4 Transparent p-AlGaN Contact Layer
5 p-AlGaN Layer
6 Electron Blocking Layer
7 Barrier Layer
8 Quantum Well Layer
9 Barrier Layer
10 n-AlGaN Layer
11 AlN Buffer Layer
12 Sapphire Substrate
100b Photonic Crystal Periodic Structure
101b Circular Hole (Columnar Structure)

1  Al (or Au) Reflecting Electrode Layer
2  Ni (or Pd) Layer
3  p-GaN Contact Layer
4  Transparent p-AlGaN Contact Layer
5  p-AlGaN Layer
6  Electron Blocking Layer
7  Barrier Layer
8  Quantum Well Layer
9  Barrier Layer
10  n-AlGaN Layer
11  AlN Buffer Layer
12  Sapphire Substrate
100c  Photonic Crystal Periodic Structure
101c  Circular Hole (Columnar Structure)

1 Al (or Au) Reflecting Electrode Layer
2 Ni (or Pd) Layer
3 p-GaN Contact Layer
4 Transparent p-AlGaN Contact Layer
5 p-AlGaN Layer
6 Electron Blocking Layer
7 Barrier Layer
8 Quantum Well Layer
9 Barrier Layer
10 n-AlGaN Layer
11 AlN Buffer Layer
12 Sapphire Substrate
110 Photonic Crystal Periodic Structure
111 Circular Hole (Columnar Structure)

1 Al (or Au) Reflecting Electrode Layer
2 Ni (or Pd) Layer
3 p-GaN Contact Layer
4 Transparent p-AlGaN Contact Layer
5 p-AlGaN Layer
6 Electron Blocking Layer
7 Barrier Layer
8 Quantum Well Layer
9 Barrier Layer
10 n-AlGaN Layer
11 AlN Buffer Layer
12 Sapphire Substrate 232 Silicon-Containing Resist
231 Organic Resist Film
1 Al (or Au) Reflecting Electrode Layer
2 Ni (or Pd) Layer
3 p-GaN Contact Layer
4 Transparent p-AlGaN Contact Layer
5 p-AlGaN Layer 200 Resin Mold
210 UV Light Source
220 High Tracking Mechanism
230 Photoresist Film (on Al electrode layer)
240 High Rigidity/High-Precision Stage 200 Die (Resin Mold)
232 Silicon-Containing Resist
232d Residual Silicon Resist
231 Organic Resist Film
1 Al (or Au) Reflecting Electrode Layer
2 Ni (or Pd) Layer
3 p-GaN Contact Layer
4 Transparent p-AlGaN Contact Layer
5 p-AlGaN Layer 301 Plasma of Oxygen-Containing Gas and Fluorine-Containing Gas
232 Silicon-Containing Resist
231 Organic Resist Film
1 Al (or Au) Reflecting Electrode Layer
2 Ni (or Pd) Layer
3 p-GaN Contact Layer
4 Transparent p-AlGaN Contact Layer
5 p-AlGaN Layer 302 Chlorine-Containing Plasma
232a Silicon Oxide Film
231 Organic Resist Film
1 Al (or Au) Reflecting Electrode Layer
2 Ni (or Pd) Layer
3 p-GaN Contact Layer
4 Transparent p-AlGaN Contact Layer
5 p-AlGaN Layer 1 Al (or Au) Reflecting Electrode Layer
2 Ni (or Pd) Layer
3 p-GaN Contact Layer
4 Transparent p-AlGaN Contact Layer
5 p-AlGaN Layer
110 Penetrating Photonic Crystal Periodic Structure

DEEP ULTRAVIOLET LED AND METHOD FOR MANUFACTURING THE SAME

TECHNICAL FIELD

The present invention relates to a technology of a deep ultraviolet LED typified by an AlGaN-based deep ultraviolet LED (Light Emitting Diode) that is a III-V group nitride semiconductor light emitting element.

BACKGROUND ART

As an example of a deep ultraviolet LED with a light emission wavelength of 220 to 350 nm, there is known an AlGaN-based deep ultraviolet LED with a design wavelength of 280 nm that has a structure in which a p-GaN contact layer with high absorptance of deep ultraviolet rays is combined with an Au electrode with low reflectivity of deep ultraviolet rays. There is also known a technique of replacing such a p-GaN contact layer with a p-AlGaN contact layer that is transparent to the deep ultraviolet rays, and further replacing the Au electrode with an Al reflecting electrode with high reflectivity, thereby improving the LEE (Light Extraction Efficiency) as well as improving the EQE (External Quantum Efficiency).

Non Patent Literature 1 and Non Patent Literature 2 report that, regarding the above technique, inserting a Ni layer, which is as thin as 1 nm and thus has suppressed absorption of deep ultraviolet rays, between the Al reflecting electrode and the transparent p-AlGaN contact layer to obtain ohmic contact therebetween was found to improve the LEE to 15% and also improve the EQE from 3.8% to 7%.

CITATION LIST

Patent Literature

Patent Literature 1: WO2012/127660 A
Patent Literature 2: JP 5315513A

Non Patent Literature

Non Patent Literature 1: Proceedings of the 60th Lecture Presentation in Spring of the Japan Society of Applied Physics (Spring 2013, Kanagawa Institute of Technology) 29p-G21-10
Non Patent Literature 2: CREST Research Area of the Strategic Basic Research Programs "Light/Photon Science and Technology toward Creation of New Function," Report on the termination of the research for a research subject "Research of 230-350 nm Band InAlGaN-based Deep Ultraviolet High-Efficiency Light Emitting Device" (research period: October, 2007 to March, 2013)

SUMMARY OF INVENTION

Technical Problem

However, when a transparent p-AlGaN contact layer is used, the forwarding voltage is increased by about 5 V as compared to when the conventional p-GaN contact layer is used. Thus, the wall-plug efficiency (WPE) deteriorates to 3%. This is estimated to be due to the reason that ohmic contact between the transparent p-AlGaN contact layer and the Al reflecting electrode cannot be sufficiently secured even if a Ni layer is inserted. Further, stacking the Ni layer while controlling the thickness thereof to as thin as 1 nm involves great technical difficulties, and thus has a great influence on the production cost and yield when producing products. Thus, improvement of the LED structure to obtain WPE at about an equal level to EQE is still a challenge to be achieved.

In response to such a background, Patent Literature 1 discloses improving the light extraction efficiency by providing an opening in the p-GaN contact layer, thereby causing a part of light from a light emitting layer that has passed through the opening to be partially reflected by a reflecting metal layer. However, the influence of absorption of light by the p-GaN contact layer other than the opening cannot be eliminated. That is, it has been basically impossible to control and suppress absorption of light by the p-GaN contact layer.

Meanwhile, in Patent Literature 2 that is related to an invention of the applicant of the present invention, the LEE is improved by forming one or more photonic crystals with a periodic structure that satisfies Bragg scattering conditions at an interface between two structures with different refractive indices at a given depth position of a light extraction layer. However, the embodiment of Patent Literature 2 is related to improving the LEE by forming the photonic crystal periodic structure in the light extraction layer and thus suppressing total reflection of light with the design wavelength at the interface. That is, Patent Literature 2 does not specifically disclose introducing a photonic crystal periodic structure for reflection purposes that is formed such that it penetrates a plurality of layers by giving priority to transmission of light with the photonic crystal periodic structure.

It is an object of the present invention to increase the light extraction efficiency of a deep ultraviolet LED while maintaining high power conversion efficiency thereof.

Solution to Problem

According to one aspect of the present invention, there is provided a deep ultraviolet LED with a design wavelength of λ, including a reflecting electrode layer, a metal layer, a p-type GaN contact layer, and a p-type AlGaN layer that are sequentially stacked from a side opposite to a substrate, the p-type AlGaN layer being transparent to light with the wavelength of λ; and a photonic crystal periodic structure provided in a range including at least an interface between the p-type GaN contact layer and the p-type AlGaN layer in a thickness direction. The photonic crystal periodic structure has a photonic band gap.

Regarding a decrease in the wall-plug efficiency (WPE) with an increase in the contact resistance, which becomes a problem when the external quantum efficiency (EQE) is improved by providing the p-type AlGaN layer and high-efficiency Al reflecting electrode, it is possible to lower the contact resistance and improve the wall-plug efficiency (WPE) by providing a p-type GaN contact layer, while it is possible to improve the LEE by providing a reflecting photonic crystal periodic structure in the p-type GaN contact layer and the p-type AlGaN layer.

The reflecting photonic crystal periodic structure reflects light with the wavelength of λ by having a photonic band gap. Thus, as the absorption of light by the metal layer and the p-type nitride semiconductor can be suppressed, the light extraction efficiency can be increased.

According to another aspect of the present invention, there is provided a method for manufacturing a deep ultraviolet LED, including a step of preparing a stacked structure with a design wavelength of λ, the stacked structure including a reflecting electrode layer, a metal layer, a p-type GaN contact layer, and a p-type AlGaN layer that are sequentially stacked from a side opposite to a substrate, the p-type AlGaN layer being transparent to light with the wavelength of λ;

a step of preparing a mold for forming a photonic crystal periodic structure, the photonic crystal periodic structure being provided in a range including at least an interface between the p-type GaN contact layer and the p-type AlGaN layer in a thickness direction;

a step of forming a resist layer on the stacked structure and imprinting a structure of the mold to the resist layer; and a step of forming a photonic crystal periodic structure by sequentially etching the stacked structure using the resist layer as a mask.

This specification contains the descriptions of the specification and/or drawings of the Japanese patent application JP 2014-043388 that serves as a basis for priority claim of the present application.

Advantageous Effects of Invention

According to the present invention, it is possible to significantly improve the LEE while avoiding deterioration of the WPE.

DESCRIPTION OF EMBODIMENTS

Hereinafter, embodiments of the present invention will be described in detail with reference to the drawings. As an example, a deep ultraviolet LED structure of an AlGaN-based deep ultraviolet LED is shown that can prevent deterioration of ohmic contact by using a p-GaN contact layer (i.e., p-GaN contact layer) and a transparent p-AlGaN contact layer (i.e., p-AlGaN contact layer) in combination, thereby preventing deterioration of the WPE as well as improving the LEE without requiring thinness of a stacked metal layer.

Figure 1A:
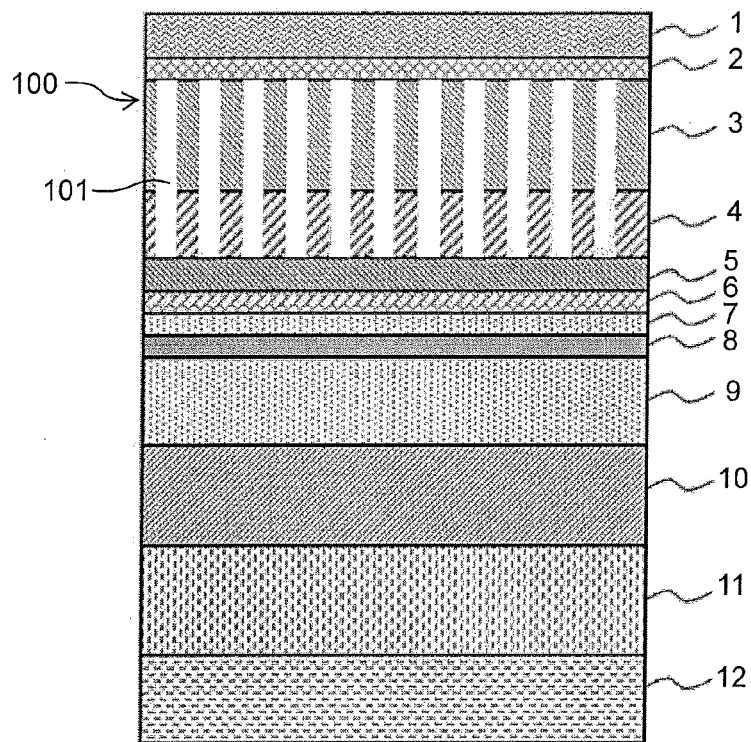
FIG. 1A is a diagram representing an exemplary cross-sectional structure and planar structure of a photonic crystal periodic structure in accordance with an example of the present invention.
Figure 1A:
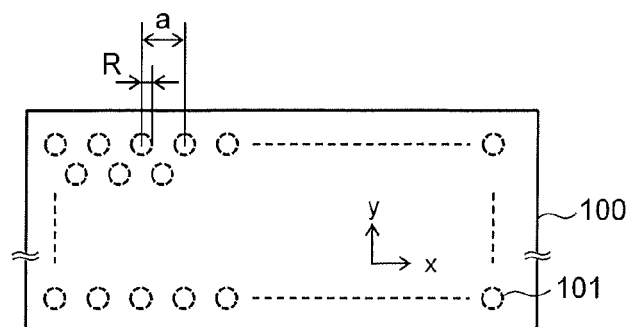

FIG. 1A(a) represents the structure of an AlGaN-based deep ultraviolet LED with a design wavelength λ of 280 nm as an example of a deep ultraviolet LED in accordance with the first embodiment of the present invention. FIG. 1A(b) is a plan view thereof. Specifically, the LED has an Al (or Au) reflecting electrode layer 1 as a reflecting electrode layer that reflects light with the wavelength λ, Ni (or Pd) layer 2 as a metal layer, a p-GaN contact layer (i.e., p-type GaN contact layer) 3 as a contact layer made of a p-type nitride semiconductor, a transparent p-AlGaN contact layer (i.e., p-type AlGaN contact layer) 4 as a transparent p-type nitride semiconductor contact layer that is almost transparent to light with the wavelength λ, and a p-AlGaN layer 5 as a p-type nitride semiconductor layer. Such layers are sequentially stacked from the side opposite to the substrate, and a photonic crystal periodic structure 100 is provided that penetrates at least the p-GaN contact layer 3 and the transparent p-AlGaN contact layer 4. The photonic crystal periodic structure 100 is a reflecting photonic crystal periodic structure (with a high reflection effect) that reflects light with the wavelength λ by having a photonic band gap. As shown in the xy plan views of FIGS. 1A(a) and 1A(b), a hole structure is provided in which columnar structures 101, such as the air, which are columnar in shape and have a smaller refractive index than the p-GaN contact layer 3 and the transparent p-AlGaN contact layer 4, are formed in a triangular lattice shape with a period of a along the X and Y directions.

The columnar structure 101 is provided in the range including the interface between the p-GaN contact layer 3 and the transparent p-AlGaN contact layer 4 in the thickness direction.

Figure 1B:
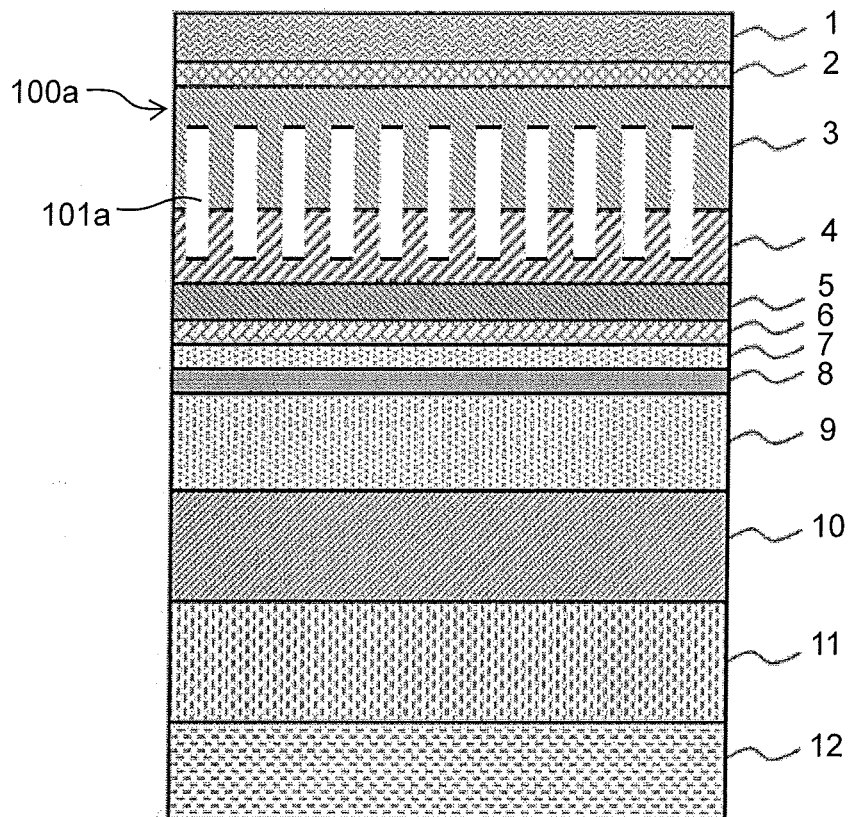
FIG. 1B is a diagram representing another exemplary cross-section of a photonic crystal periodic structure in accordance with an example of the present invention.
Figure 1C:
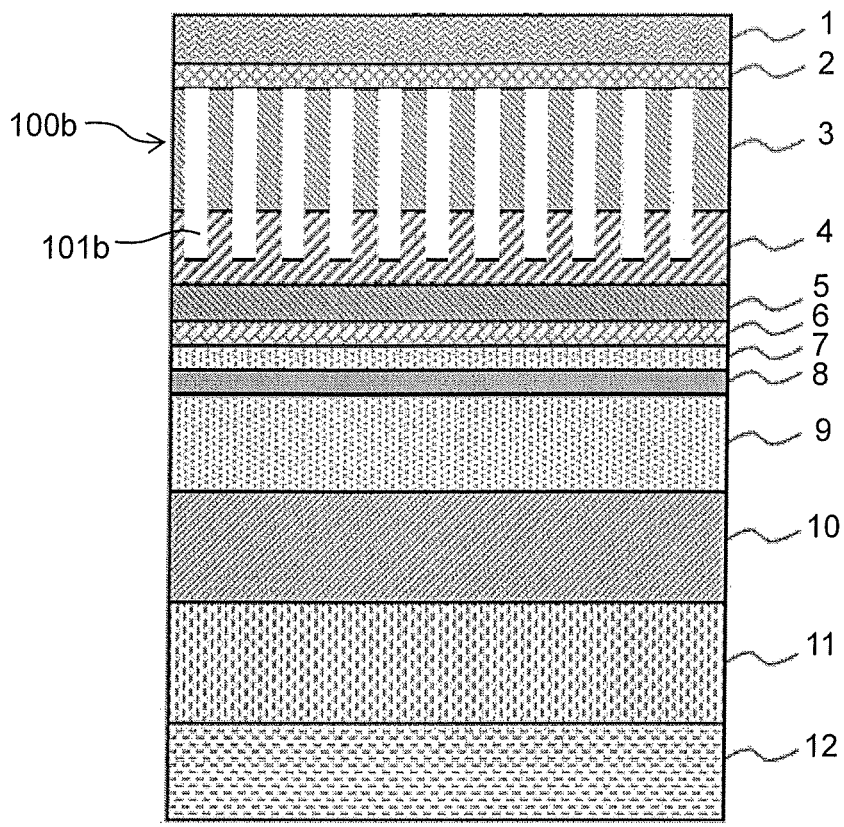
FIG. 1C is a diagram representing another exemplary cross-section of a photonic crystal periodic structure in accordance with an example of the present invention.
Figure 1D:
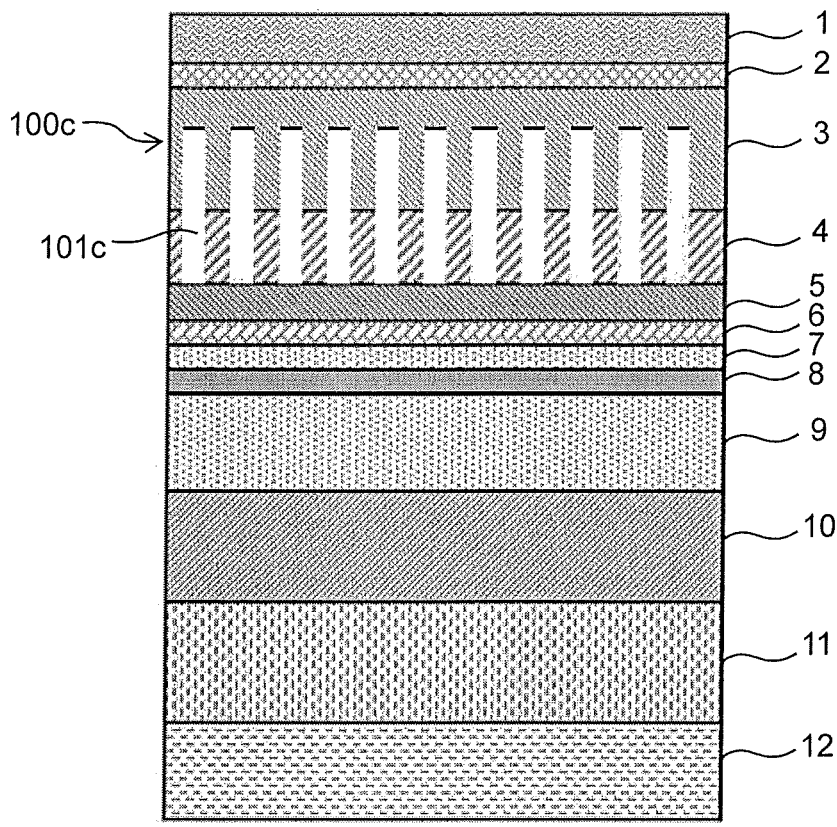
FIG. 1D is a diagram representing another exemplary cross-section of a photonic crystal periodic structure in accordance with an example of the present invention.

As shown in FIG. 1B, a columnar structure 101a may have a structure in which the structure does not reach the interface between the p-GaN contact layer 3 and the Ni layer 2. As shown in FIG. 1C, a columnar structure 101b may have a structure in which the structure does not reach the interface between the transparent p-AlGaN contact layer 4 and the p-AlGaN layer 5. In addition, as shown in FIG. 1D, a columnar structure 101c may have a structure in which the structure does not reach the interface between the p-GaN contact layer 3 and the Ni layer 2.

That is, it is acceptable as long as the photonic crystal periodic structure is provided in the range including at least the interface between the p-type GaN contact layer 3 and the p-type AlGaN contact layer 4 in the thickness direction.

Figure 1E:
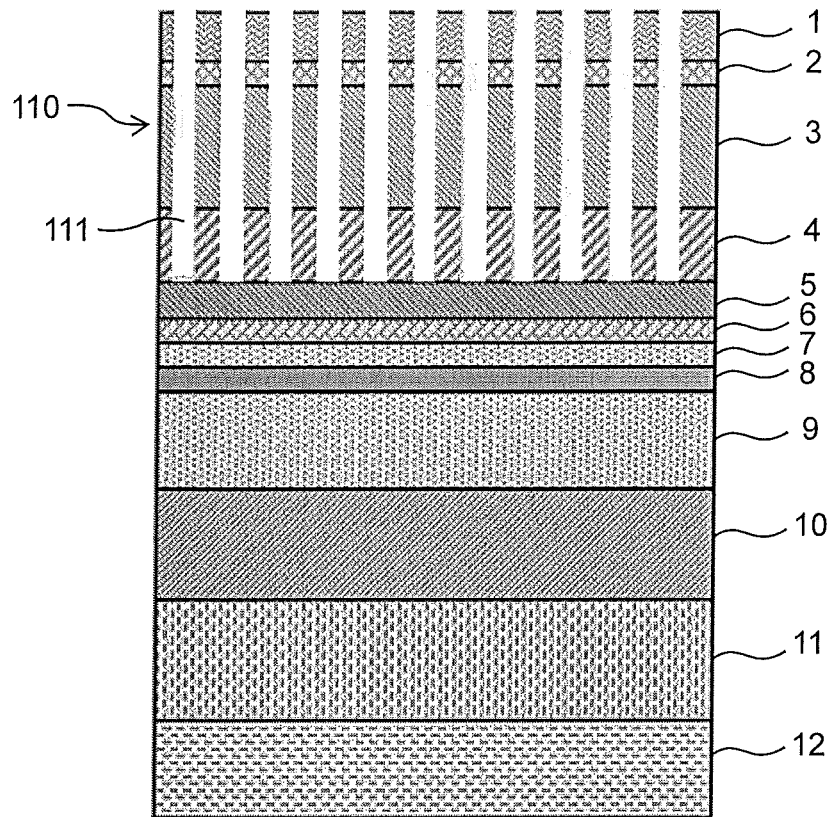
FIG. 1E is a diagram representing another exemplary cross-section of a photonic crystal periodic structure in accordance with an example of the present invention.

It should be noted that a photonic crystal periodic structure 110 shown in FIG. 1E shows a view of a reflecting photonic crystal periodic structure that is formed such that it penetrates all layers of from the Al reflecting electrode layer 1 to the transparent p-AlGaN contact layer 4. (An)other layer(s) may also be included within the range that the relative order of the layer 1 to the layer 5 is unchanged. It should be noted that the transparent p-type nitride semiconductor contact layer 4 may typically be referred to as a p-type nitride semiconductor layer, and such p-type nitride semiconductor layer may combine the function of the p-AlGaN layer 5.

The photonic crystal periodic structure 100 or 110 is a reflecting photonic crystal periodic structure in which triangular lattices, each of which includes circular holes with bottom surfaces, are repeated as unit structures on the planes of the stacked layers. It should be noted that the unit structures may also be other unit structures such as tetragonal lattices. The photonic crystal periodic structure is desirably formed on the entire planes of the stacked layers to improve the LEE, but may also be formed on a part of the planes.

The transparent p-AlGaN contact layer 4 may also be understood as a structure in which the thickness of a p-GaN contact layer, which absorbs light with the wavelength λ, is partially replaced by a p-AlGaN contact layer that contains 50% Al and is transparent to light with the wavelength λ. Herein, the term "transparent" means that the transmissivity with respect to light with the wavelength λ is greater than or equal to 95%, for example. As the Ni layer 2 strongly absorbs light with the wavelength λ, it is desirable that the Ni layer 2 be ideally extremely thin, as thin as about 1 nm. However, the Ni layer 2 may also have a thickness of greater than or equal to about 10 nm by taking practicality into consideration.

The reflecting photonic crystal periodic structure 100 or 110 refers to a structure in which, as represented in FIGS. 1A and 1B, the depth h is ideally controlled so that the bottom surfaces of the circular holes are located at the interface between the transparent p-AlGaN contact layer 4 and the p-AlGaN layer 5. It should be noted that the transparent p-AlGaN contact layer 4 may combine the function of the p-AlGaN layer 5. In such a case, the bottom surfaces of the circular holes (i.e., depth h) may be located in the p-AlGaN layer 5.

Further, it is also possible to provide a LED structure in which a transmissive photonic crystal periodic structure is also formed on the light extraction surface side of a sapphire substrate 12, for example, in addition to the reflecting photonic crystal periodic structure 100 or 110 in accordance with this embodiment. Such a structure may rather have improved LEE than a LED structure that has a single reflecting photonic crystal periodic structure formed therein.

According to this embodiment, regarding a decrease in the wall-plug efficiency (WPE) with an increase in the contact resistance, which becomes a problem when the external quantum efficiency (EQE) is improved by providing a transparent p-type nitride semiconductor contact layer and a high-efficiency Al reflecting electrode, it is possible to lower the contact resistance with the electrode by providing a p-GaN contact layer, while it is possible to improve the LEE by providing a reflecting photonic crystal periodic structure.

A deep ultraviolet LED in accordance with the second embodiment of the present invention is a deep ultraviolet LED in which the photonic crystal periodic structure described in the first embodiment is designed to satisfy the following requirements. That is, the photonic crystal periodic structure has transparent p-AlGaN and the air, which have different refractive indices, formed as two structures at the bottom surface, and satisfies Bragg scattering conditions represented by the following formula provided that the average refractive index of the structures is $n_{av}$ (where $n_{av}$ is the function of the period a and the radius R of the circular hole) and the period is a.

$$m\lambda/n_{av}=2a \quad \text{(Formula 1)}$$

Herein, the order m is an important parameter that is in the range of 1<m<5 and determines the radius R of the circular hole, the period a, and the processing depth h that maximize the LEE. Specifically, the order m at which the LEE is maximum is selected from the range using the FDTD method (a finite-difference time-domain method) described below. The range of the order m is limited herein for the following reason. That is, if m=1, the diameter of the pillar structure is about several 10 nm, which makes little difference from a differential spatial resolution of 20 nm that results when a computation model is discretized, without the need to conduct simulation with the FDTD method. Thus, m=1 may be excluded from the range as such a value is not determined to correctly reflect the shape of the actual periodic structure. If m=5, the period in the deep ultraviolet LED is about 400 nm, which greatly differs from the design wavelength of 280 nm. Thus, m=5 may be excluded from the range.

According to the second embodiment, it is possible to improve the LEE, which is difficult to be achieved with a periodic structure that only has a period a, which has about the same value as the design wavelength of the deep ultraviolet LED, and the radius R of a circular hole.

The deep ultraviolet LED in accordance with the third embodiment of the present invention is a deep ultraviolet LED in which the parameters of the photonic crystal periodic structure with the photonic band gap described in the second embodiment are determined in accordance with the following procedures. That is, the band structure of the TE polarized components is analyzed by a plane wave expansion method using R/a, which is the ratio of the radius R of the circular hole to the period a tentatively determined in advance, the design wavelength λ, and the dielectric constants $\in_1$ and $\in_2$ of the two structures corresponding to the refractive indices $n_1$ and $n_2$ of the respective structures. Specifically, the dielectric constants $\in_1$ and $\in_2$ are input to the Maxwell's electromagnetic field wave equation (Formula 2) represented by the following formula, which has been obtained by expanding the plane wave with a wavelength of λ by a magnetic field H, to compute eigen values in the wave number space and thus analyze the photonic band structure of the TE polarized components. Then, the photonic band gap is determined from the analysis results, and such determination is repeated hereinafter. Accordingly, one or more candidates of R/a at which the photonic band gap is maximum is/are selected from the tentatively determined R/a.

$$\sum_{G'} \varepsilon^{-1}(G-G')(k+G)\cdot(k+G')H(G') = (\omega^2/c^2)H(G) \quad \text{(Formula 2)}$$

Herein, $\varepsilon^{-1}$ denotes an inverse number of a dielectric constant, G denotes a reciprocal lattice vector, ω denotes frequency, c denotes light velocity, and k denotes a wave number vector.

It should be noted that the photonic band structure of the TE polarized components is analyzed herein in order to cause light with the wavelength λ from the light emitting layer to be maximally reflected by the interface to the light extraction surface side. This can be explained by the fact that the electric field of TE light will easily accumulate on the plane of the periodic structure at a connected portion of dielectrics that are provided in parallel with the plane of the periodic structure, and thus that light with the wavelength λ will be reflected by the plane of the electric field due to Bragg scattering when the parameters of the periodic structure and the wavelength λ satisfy the Bragg scattering conditions.

Further, the parameters of the photonic crystal periodic structure 100 or 110 are desirably parameters obtained by computing the period a and the radius R of the circular hole, which have been obtained from the selected candidate R/a, and the processing depth h of the periodic structure with a period of greater than or equal to a, for each order m of the Bragg scattering conditions, conducting simulation on each parameter group using the FDTD method, and selecting from the simulation results an optimal combination of the order m, the period a, the radius R, and the depth h that most improves the LEE.

According to the third embodiment, TE light from the light emitting layer is reflected by the photonic crystal periodic structure. Thus, it is possible to increase the degree of freedom of selection of the types of the reflecting electrode layer and the metal layer and improve the LEE.

A deep ultraviolet LED in accordance with the fourth embodiment of the present invention is a deep ultraviolet LED characterized in that the formation (processing) depth h of the photonic crystal periodic structure 100 or 110 described in the third embodiment is greater than or equal to the period a as a condition to obtain high LEE. It should be noted that as the depth h, the total thickness of the portion of the photonic crystal periodic structure that penetrates at least the p-GaN contact layer 3 and the transparent p-AlGaN contact layer 4 is desirably greater than or equal to ⅔ of the period a, and more preferably, greater than or equal to the period a.

Even the depth h that is greater than or equal to ⅔ of the period a is effective as a reflecting photonic crystal periodic structure in view of the limitation of the processing accuracy due to the high aspect ratio. However, it is desirable to provide the depth h that is greater than or equal to the period a as in the fourth embodiment by overcoming the limitation of the accuracy using the production method described below.

According to the fourth embodiment, the effect of improving the LEE can be maximally extracted.

The deep ultraviolet LED in accordance with the fifth embodiment is a deep ultraviolet LED, characterized in that the photonic crystal periodic structure described in the fourth embodiment is the photonic crystal periodic structure 110 (reference numeral 110 of FIG. 1E) that penetrates all layers of from the Al reflecting electrode layer 1 to the transparent p-AlGaN contact layer 4.

According to the fifth embodiment, the photonic crystal periodic structure 110 can be formed at a time (in succession) such that it penetrates layers of from the reflecting electrode layer. Thus, the technical difficulty of forming the photonic crystal periodic structure in some of the layers in the LED can be avoided, thus enabling simplification of the production steps and cost reduction.

A deep ultraviolet LED in accordance with the sixth embodiment of the present invention is a deep ultraviolet LED that has the deep ultraviolet LED structure described in the fifth embodiment and has a structure in which layers described below are sequentially and relatively stacked. That is, as exemplarily described above, the deep ultraviolet LED includes, from the substrate side, the p-AlGaN layer 5 as a p-type nitride semiconductor layer, the transparent p-AlGaN contact layer 4 as a transparent p-type nitride semiconductor contact layer, and the p-GaN contact layer 3 as a contact layer on the metal layer side. The reflecting electrode layer and the metal layer can be obtained by, though not particularly limited thereto, combining an Al (or Au) reflecting electrode and a Ni (or Pd or Pt) layer. In particular, as the type of metal, metal whose adhesion to the inner wall of the circular hole can be suppressed is desirably used.

According to the sixth embodiment, a highly advantageous effect of improving the LEE of the deep ultraviolet LED can be expected to be achieved by adopting such a layer structure.

A deep ultraviolet LED in accordance with the seventh embodiment of the present invention is a deep ultraviolet LED characterized in that the photonic crystal periodic structure 100 or 110 described in the first to sixth embodiments is formed by using a imprint technology of a nanoimprinting lithography method. The nanoimprinting lithography technology is an optimal process for forming a fine projection/recess structure pattern on the order of nm to μm on the entire surface of a large substrate with a size of 8 inches, for example.

It should be noted that photoresist used in the imprint technology of the nanoimprinting lithography method should have high fluidity so as to closely fill a mold with a fine projection/recess structure pattern. However, the fluidity will cause deterioration of the etching selectivity of the transparent p-AlGaN contact layer 4. Herein, the deep ultraviolet LED in accordance with the eighth embodiment of the present invention is a deep ultraviolet LED characterized by having a photonic crystal periodic structure formed by a imprint technology using a bi-layer resist method that can provide both high fluidity and high etching selectivity.

According to the seventh embodiment, a photonic crystal periodic structure designed in accordance with this embodiment can be accurately imprinted to resist in a large area in units of nm. According to the eighth embodiment, it is possible to form a photonic crystal periodic structure with a high aspect ratio designed in accordance with any of the embodiments of the present invention.

Example 1

An example of the present invention will be described with reference to FIG. 1A. The following table (Table 1) shows the composition, dope, film thickness, refractive index, and the like of each layer. The design wavelength λ is 280 nm. The reflecting photonic crystal periodic structure formed has a photonic band gap with respect to the wavelength λ, and reflects light from the light emitting layer toward the light extraction layer side, that is, to the sapphire substrate 12 side.

TABLE 1

| 280 nm | Al Content [%] | Dope | Thickness [nm] | Refractive Index | Extinction Coefficient |
|---|---|---|---|---|---|
| Al Electrode Layer | Reflect 90% | | 150 | 0.246 | 3.401 |
| Ni Layer | Absorb | | 10 | 1.681 | 2.067 |
| p-GaN Contact Layer | Absorb | | 50 | 2.76 | 0.75 |
| Transparent p-AlGaN Contact Layer | Transmit 95% or More | 50 Mg | 250 | 2.65 | |
| p-AlGaN Layer | 60 | Mg | 20 | 2.56 | |
| Electron Blocking Layer | 95 | Mg | 20 | 2.28 | |
| Barrier Layer | 60 | | 10 | 2.56 | |
| Well Layer | 40 | | 10 | 2.77 | |
| Barrier Layer | 60 | | 10 | 2.56 | |
| n-AlGaN Buffer Layer | 60 | Si | 200 | 2.56 | |
| AlN Buffer Layer | | | 500 | 2.24 | |
| Sapphire Substrate | | | 1500 | 1.82 | |

The photonic crystal periodic structure is a reflecting photonic crystal periodic structure that includes circular holes with bottom surfaces at the interface between the transparent p-AlGaN contact layer 4 and the p-AlGaN layer 5, and has a triangular lattice formed by the circular holes as a unit structure. Two structures with different refractive indices that form such a periodic structure are transparent p-AlGaN and the air or another medium. The average refractive index $n_{av}$ thereof is determined by the following formula (Formula 3).

It should be noted that the transparent p-AlGaN contact layer 4 and the p-AlGaN layer 5 may be combined as a single layer. The transparent p-AlGaN contact layer 4 may simply be referred to as a p-type AlGaN layer. The composition, dope, film thickness, refractive index, and the like of each layer, including Table 1, are exemplary values used in the simulation. Thus, the structure of the deep ultraviolet LED, including transparency, is not limited to the parameters shown in the table.

In Example 1 herein, it is desirable that the photonic crystal periodic structure 110 be ideally formed such that it penetrates all layers of from the Al reflecting electrode layer 1 to the transparent p-AlGaN contact layer 4, and also that the air be used as the medium of the circular hole in view of the production cost and the like. Meanwhile, when the photonic crystal periodic structure 100 that penetrates only the p-GaN contact layer 3 and the transparent p-AlGaN contact layer 4 is formed, using a liftoff method in the stacking step will allow the use of the air as the medium of the circular hole as with the photonic crystal periodic structure 110 that is formed such that it penetrates all layers of from the Al reflecting electrode layer 1 to the transparent p-AlGaN contact layer 4. In addition, the medium is not necessarily limited to the air as long as, if the high-level technical problem and cost disadvantages can be overcome, it has a lower refractive index than the transparent p-AlGaN contact layer 4 and does not absorb light with the wavelength λ.

It should be noted that the transparent p-AlGaN contact layer 4 may combine the function of the p-AlGaN layer 5. In such a case, the bottom surfaces of the circular holes (i.e., depth h) may be located in the p-AlGaN layer 5.

$$n_{av}^2 = n_2^2 + (n_1^2 - n_2^2)(2\pi/\sqrt{3})(R/a)^2 \quad \text{(Formula 3)}$$

Herein, R/a that is the ratio of the radius R of the circular hole to the period a is finally determined as a value at which the LEE is the maximum through the following steps. However, R/a is tentatively determined herein. The average refractive index $n_{av}$ is computed assuming that the tentatively determined R/a is 0.40, the refractive index ($n_2$) of the transparent p-AlGaN contact layer 4 is 2.65, and the refractive index ($n_1$) of the air is 1.00.

Next, the radius R and the period a corresponding to the tentatively determined R/a (0.40) are determined from the $n_{av}$ (1.88) herein and the Bragg scattering conditions of the following formula (Formula 4) for each order m (1<m<5).

$$m\lambda/n_{av} = 2a \quad \text{(Formula 4)}$$

As a result, it is found that a=149 and R=59.5 when m=2; a=224 and R=89.5 when m=3; and a=298 and R=119.5 when m=4.

Further, the band structure is analyzed by a plane wave expansion method using the tentatively determined R/a, the refractive indices $n_1$ and $n_2$, and the dielectric constants $\epsilon_1$ (1.00) and $\epsilon_2$ (7.02) corresponding thereto. Specifically, the dielectric constants $\epsilon_1$ and $\epsilon_2$ and R/a are input to the Maxwell's electromagnetic field wave equation represented by the following formula (Formula 5), which has been obtained by expanding a plane wave with a wavelength of λ by a magnetic field H, to compute eigen values in the wave number space and thus determine the photonic band structure of the TE polarized components. Then, the photonic band gap is determined from the thus determined band structure.

$$\sum_{G'} \epsilon^{-1}(G - G')(k + G) \cdot (k + G')H(G') = (\omega^2/c^2)H(G) \quad \text{(Formula 5)}$$

Herein, $\epsilon^{-1}$ denotes an inverse number of a dielectric constant, G denotes a reciprocal lattice vector, ω denotes frequency, c denotes light velocity, and k denotes a wave number vector.

Again, new R/a (in Example 1 herein, R/a=0.25, 0.30, 0.35, etc.) is tentatively determined to determine the photonic band gap of the TE polarized components in the same way. Such a step is repeated to study which R/a provides the maximum photonic band gap, and thus select a candidate R/a. The period a and the radius R are computed from the selected candidate R/a for each order m of the Bragg scattering conditions as described above, and further, the processing depth h of the photonic crystal periodic structure is added as a parameter to conduct simulation using the FDTD method. Then, a combination of the order m, the period a, the radius R, and the depth h at which the maximum LEE is exhibited is determined. Consequently, it was determined that R/a=0.40, the order m=4, the period a=298 nm, and the radius R=119.5 nm in Example 1 herein.

The LEE rate of change that is an index of the advantageous effect of Example 1 herein is represented by the following formula (Formula 6), that is, the rate of change of the output 2 relative to the output 1.

LEE Rate of Change=(Output 2−Output 1)/Output 1 (Formula 6)

Figure 2:
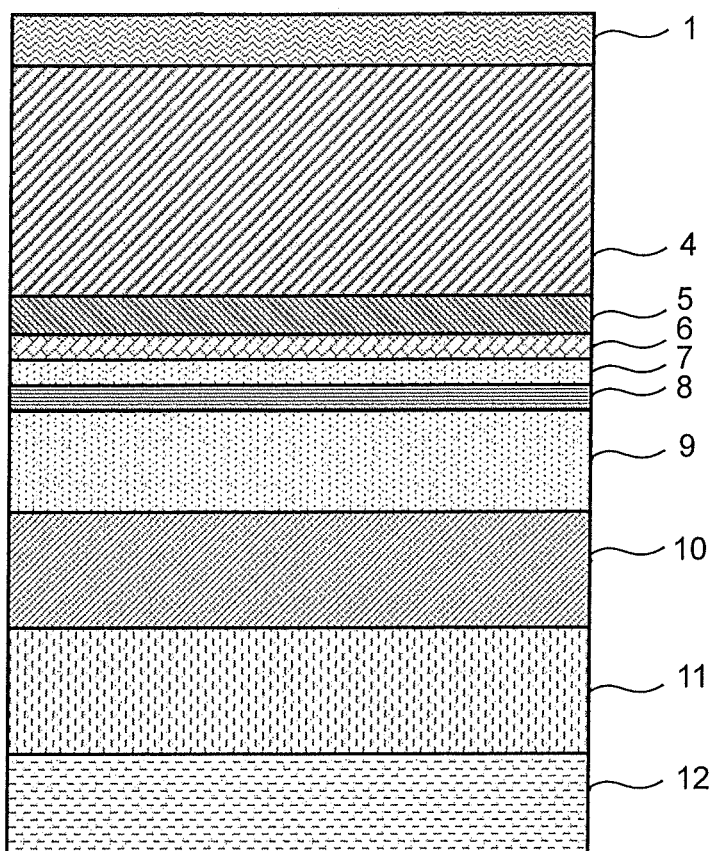
FIG. 2 is a diagram representing the cross-section of a photonic crystal periodic structure used as a reference in computation of the LEE rate of change.

Herein, the output 2 is the optical output value of the LED structure that is the result of Example 1 herein, while the output 1 is the optical output value as a reference to be compared with the output 2. The LED structure corresponding to the output 1 is as shown in the following table (Table 2) and FIG. 2. The LED structure herein does not have formed therein the reflecting photonic crystal periodic structure in accordance with this embodiment. Further, the structure does not include a metal layer or a p-GaN contact layer, but instead, both the layers are replaced by the transparent p-AlGaN contact layer 4. It should be noted that the optical output value is the value of an optical output from the light emitting layer with the deep ultraviolet LED structure that is received by a monitor arranged on each of the side surfaces (i.e., four outer wall surfaces) and the front surfaces (i.e., top surface and bottom surface) of the LED used for a simulation model based on the FDTD method.

TABLE 2

| 280 nm | | Al Content [%] | Dope | Thickness [nm] | Refractive Index | Extinction Coefficient |
|---|---|---|---|---|---|---|
| Al Electrode Layer | Reflect 90% | | | 160 | 0.246 | 3.401 |
| Ni Layer | Absorb | | | 0 | 1.681 | 2.067 |
| p-GaN Contact Layer | Absorb | | | 0 | 2.76 | 0.75 |
| Transparent p-AlGaN Contact Layer | Transmit 95% or More | 50 | Mg | 300 | 2.65 | |
| p-AlGaN Layer | | 60 | Mg | 20 | 2.56 | |
| Electron Blocking Layer | | 95 | Mg | 20 | 2.28 | |
| Barrier Layer | | 60 | | 10 | 2.56 | |
| Well Layer | | 40 | | 10 | 2.77 | |
| Barrier Layer | | 60 | | 10 | 2.56 | |
| n-AlGaN Buffer Layer | | 60 | Si | 200 | 2.56 | |
| AlN Buffer Layer | | | | 500 | 2.24 | |
| Sapphire Substrate | | | | 1500 | 1.82 | |

Figure 3:
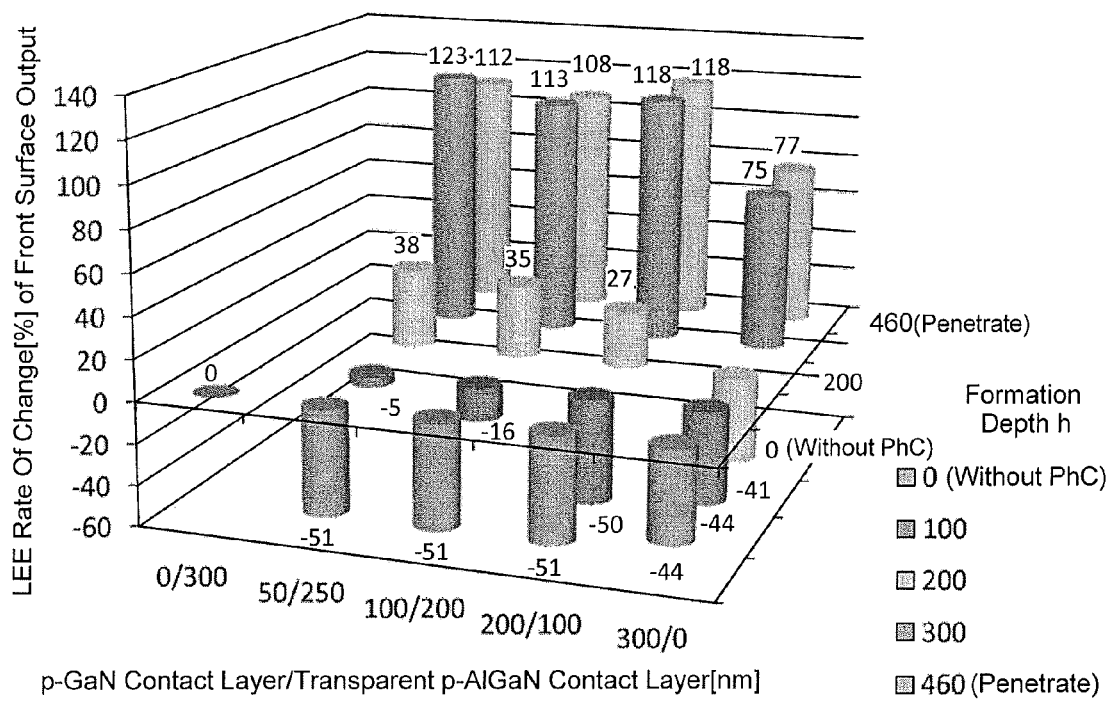
FIG. 3 shows a diagram showing the results of comparison between the LEE of the front surface output of the LED structure shown in FIGS. 1A and 1B and the LEE of the front surface output of the LED structure shown in FIG. 2.

Table 3 and FIG. 3 show the simulation results of the FDTD based on the parameters of the reflecting photonic crystal periodic structure determined by the aforementioned design. Specifically, in FIG. 3, a combination of the thicknesses of the p-GaN contact layer 3 and the transparent p-AlGaN contact layer 4 and the depth h at which the photonic crystal periodic structure is formed were used as parameters, and the LEE of the front surface output of each LED structure was compared with the LEE of the front surface output of the LED structure in FIG. 2 so as to be compared as the LEE rate of change.

TABLE 3

LEE Rate of Change [%] (Front Surface Output)

| p-GaN Contact Layer/ Transparent p-AlGaN Contact Layer ([nm]/[nm]) | Depth at which PhC is formed ([nm]) | | | | |
|---|---|---|---|---|---|
| | 0 (Without PhC) | 100 | 200 | 300 | 460 (Penetrate) |
| 0/300 | 0 | | | | |
| 50/250 | −51 | −5 | 38 | 123 | 112 |
| 100/200 | −51 | −16 | 35 | 113 | 108 |
| 200/100 | −51 | −50 | 27 | 118 | 118 |
| 300/0 | −44 | −44 | −41 | 75 | 77 |

Table 3 and the ordinate axis of FIG. 3 show the LEE rate of change ([%]) of the output of the front surface of the LED.

The leftmost column of Table 3 and the abscissa axis of FIG. 3 represent a combination of the thicknesses of the p-GaN contact layer 3 and the transparent p-AlGaN contact layer 4 (represented by [nm]/[nm]), which include 0/300, 50/250, 100/200, 200/100, and 300/0. It should be noted that the total thickness of the two layers herein was set to 300 nm for the sake of convenience to compare the increase/decrease of the LEE in accordance with not only the influence of the thickness of each layer but also the ratio of the thicknesses of the two layers. Herein, the case of 300/0 corresponds to a comparison example of Example 1 herein, which represents a LED structure without the transparent p-AlGaN contact layer in accordance with the embodiment of the present invention. Likewise, the case of 0/300 represents the LED structure in FIG. 2 (without a photonic crystal periodic structure) corresponding to the output 1 that is the reference used to compute the LEE rate of change.

The uppermost row of Table 3 and the axis in the depth direction of FIG. 3 represent the depth h at which the photonic crystal periodic structure is formed, which include 0, 100, 200, 300, and 460 nm. The case where the depth h is 300 nm corresponds to a case where a periodic structure is formed in each of the p-GaN contact layer 3 and the transparent p-AlGaN contact layer 4. Likewise, the case where the depth is 460 nm corresponds to a case where a periodic structure is formed such that it penetrates all layers of from the Al reflecting electrode layer 1 to the transparent p-AlGaN contact layer 4. In Table 3 and FIG. 3, this is indicated by "Penetrate." The case where the depth is 0 nm represents the output 1 (LEE rate of change=0), which is the reference used to compute the LEE increase-decrease rate, of the LEE structure in FIG. 2.

As is clear from the results shown in Table 3 and FIG. 3, the front surface output of the LED is significantly increased by the introduction of the transparent p-AlGaN contact layer 4 and the formation of the reflecting photonic crystal periodic structure 100 or 110. Specifically, the thickness of the p-GaN contact layer 3 that absorbs light with the wavelength λ was suppressed to the range of 50 to 200 nm, while the transparent p-AlGaN contact layer 4 in the range of 250 to 100 nm was introduced, and further, the reflecting photonic crystal periodic structure was formed at a depth h of greater than or equal to 300 nm that is about equal to the period a, whereby it was possible to obtain a LEE rate of change of greater than or equal to 113% for the front surface output of the LED, that is, an output that is 2.13 times that of the output 1. Such advantageous effect is recognized regardless of whether or not the reflecting photonic crystal periodic structure is formed such that it penetrates layers of from the Al reflecting electrode layer 1 to the transparent p-AlGaN contact layer 4. When the depth h of the photonic crystal periodic structure is 200 nm, the LEE rate of change (i.e., front surface output) is increased. This corresponds to the depth of about ⅔ of the period a of the structure in this example. From the results, it can be said that the reflection effect of the photonic crystal periodic structure appears even when the depth is greater than or equal to ⅔ of the period a.

Figure 4:
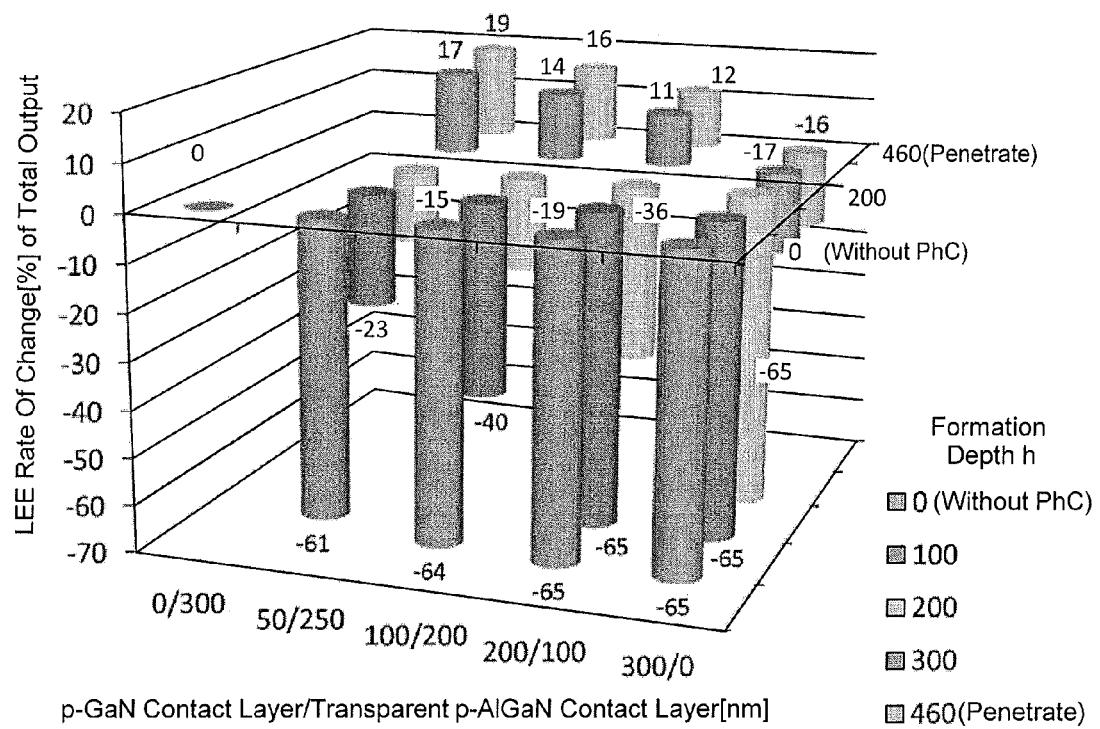
FIG. 4 is a diagram in which the LEE of the total output of the LED is compared under the same conditions as those in FIG. 3.
Figure 5:
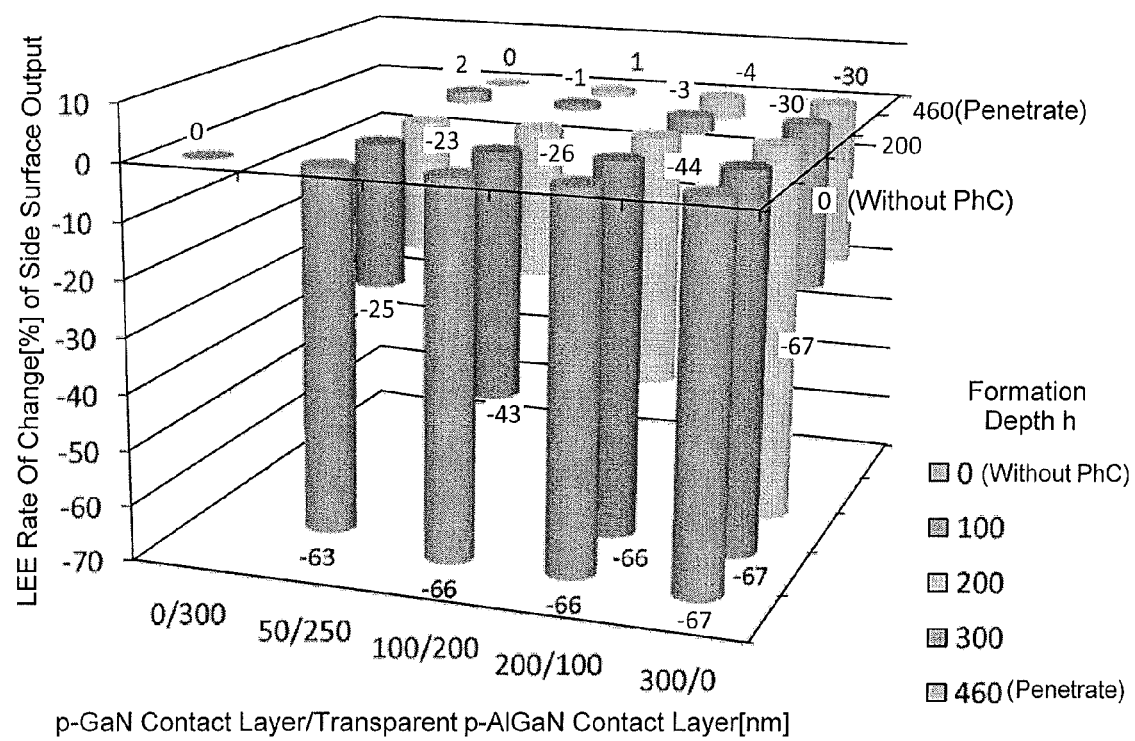
FIG. 5 is a diagram in which the LEE of the side surface output of the LED is compared under the same conditions as those in FIG. 3.

Likewise, Table 4 and FIG. 4 show the LEE increase-decrease rate of the total output of the side surfaces and the front surfaces of the LED, while Table 5 and FIG. 5 show the LEE rate of change of the side surface output.

TABLE 4

LEE Rate of Change [%] (Total Output)

| p-GaN Contact Layer/ Transparent p-AlGaN Contact Layer ([nm]/[nm]) | Depth at which PhC is formed ([nm]) | | | | |
|---|---|---|---|---|---|
| | 0 (Without PhC) | 100 | 200 | 300 | 460 (Penetrate) |
| 0/300 | 0 | | | | |
| 50/250 | −61 | −23 | −15 | 17 | 19 |
| 100/200 | −64 | −40 | −19 | 14 | 16 |
| 200/100 | −65 | −65 | −36 | 11 | 12 |
| 300/0 | −65 | −65 | −65 | −17 | −16 |

TABLE 5

LEE Rate of Change [%] (Side Surface Output)

| p-GaN Contact Layer/ Transparent p-AlGaN Contact Layer ([nm]/[nm]) | Depth at which PhC is formed ([nm]) | | | | |
|---|---|---|---|---|---|
| | 0 (Without PhC) | 100 | 200 | 300 | 460 (Penetrate) |
| 0/300 | 0 | | | | |
| 50/250 | −63 | −25 | −23 | 2 | 0 |
| 100/200 | −66 | −43 | −26 | 1 | −1 |
| 200/100 | −66 | −66 | −44 | −3 | −4 |
| 300/0 | −67 | −67 | −67 | −30 | −30 |

From Table 4 and FIG. 4, similar results to those of the aforementioned discussion can be obtained. Specifically, introducing the transparent p-AlGaN contact layer 4 in the range of 250 to 100 nm (suppressing the range of the p-GaN contact layer to 50 to 200 nm) and forming the reflecting photonic crystal periodic structure at a depth h of greater than or equal to 300 nm can obtain LEE that is 1.19 times higher at a maximum.

It should be noted that depending on the package structure of the LED or the application of the LED, a reference used to determine whether or not each of the parameters of the photonic crystal periodic structure at that time is optimum will differ in accordance with the results of the FDTD simulation. That is, a variety of references, such as the output of the front surfaces of the LED, the total output of the output of the front surfaces and the output of the side surfaces of the LED, or luminance characteristics in the near field or the far field, may be used. Conversely, depending on the reference used, each of the parameters of the reflecting photonic crystal periodic structure that are evaluated as optimal and thus are determined will differ. It should be noted that the near field is mainly referred to when the LEE rate of change is observed, while the far field is referred to when the LEE rate of change and the angular distribution of the radiation pattern are observed.

Example 2

Figure 6:
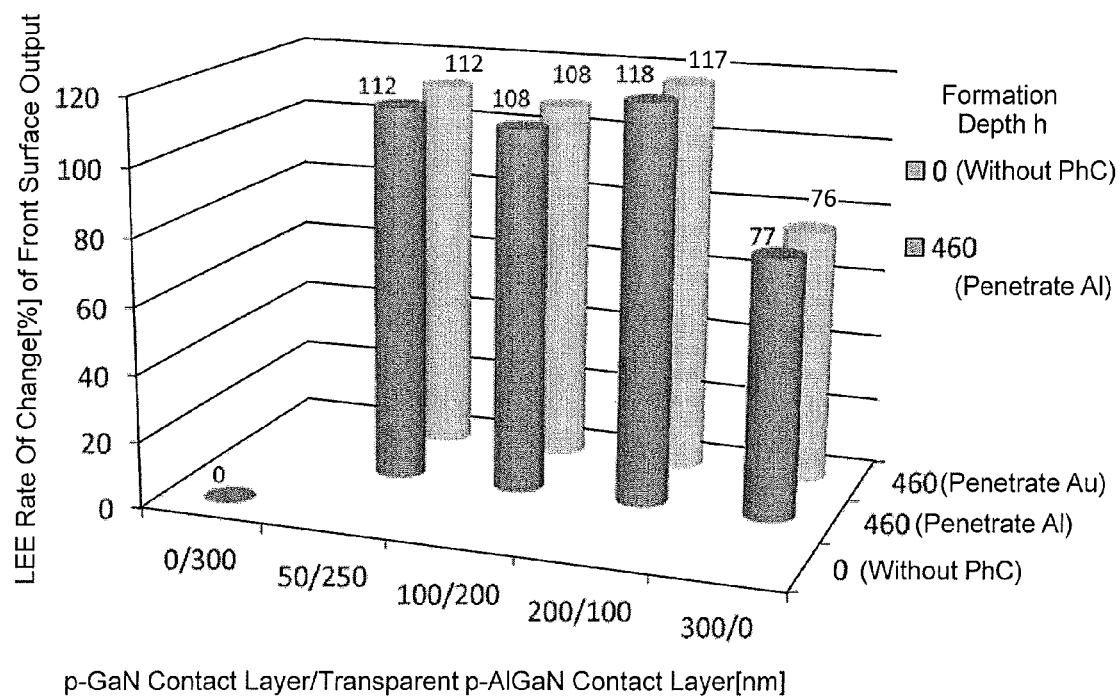
FIG. 6 is a diagram in which the LEE of the front surface outputs of LEDs with different electrodes is compared under the same conditions as those in FIG. 3.

In Example 2 herein, the LEE rate of change of the front surface output of a LED with a photonic crystal periodic structure, which is formed such that it penetrates all layers (460 nm) of from the reflecting electrode layer 1 to the transparent p-AlGaN contact layer 4, was compared for cases where the type of the electrode differs: Al or Au. Table 6 shows the LED structure when the thicknesses of the p-GaN contact layer 3 and the transparent p-AlGaN contact layer 4 are 200 and 100, respectively, and an Au electrode is used. Table 7 shows the results of comparison between the influence of the difference of the electrode on the LEE of the front surface output of the LED for each combination of the thicknesses of the p-GaN contact layer 3 and the transparent p-AlGaN contact layer 4 with the LEE of the LED structure in FIG. 2. FIG. 6 shows a diagram thereof.

TABLE 6

| 280 nm | Al Content [%] | Dope | Thickness [nm] | Refractive Index | Extinction Coefficient |
|---|---|---|---|---|---|
| Au Electrode Layer | Reflect 60% | | 130 | 1.659 | 1.861 |
| Ni Layer | Absorb | | 30 | 1.681 | 2.067 |
| p-GaN Contact Layer | Absorb | | 200 | 2.76 | 0.75 |
| Transparent p-AlGaN Contact Layer | Transmit 95% or More | 50 Mg | 100 | 2.65 | |
| p-AlGaN Layer | 60 | Mg | 20 | 2.56 | |
| Electron Blocking Layer | 95 | Mg | 20 | 2.28 | |
| Barrier Layer | 60 | | 10 | 2.56 | |
| Well Layer | 40 | | 10 | 2.77 | |
| Barrier Layer | 60 | | 10 | 2.56 | |
| n-AlGaN Buffer Layer | 60 | Si | 200 | 2.56 | |
| AlN Buffer Layer | | | 500 | 2.24 | |
| Sapphire Substrate | | | 1500 | 1.82 | |

TABLE 7

LEE Rate of Change [%] (Front Surface Output)

| p-GaN Contact Layer/ Transparent p-AlGaN Contact Layer ([nm]/[nm]) | Depth at which PhC is formed ([nm]) | | |
|---|---|---|---|
| | 0 (Without PhC) | 460 Al Electrode (Penetrate) | 460 Au Electrode (Penetrate) |
| 0/300 | 0 | | |
| 50/250 | | 112 | 112 |
| 100/200 | | 108 | 108 |
| 200/100 | | 118 | 117 |
| 300/0 | | 77 | 76 |

As is clear from the tables and drawing, there is no big difference in the LEE rate of change depending on whether an Al electrode or an Au electrode is used when the other conditions are the same. Thus, introducing the LED structure and the reflecting photonic crystal periodic structure in accordance with the present invention can increase the degree of freedom of selection of the reflecting electrode material as needed.

Example 3

In Examples 1 and 2 above, the combination of the thicknesses of the p-GaN contact layer 3 and the transparent p-AlGaN contact layer 4 that form the photonic crystal periodic structure 100 or 110 was changed in increments of 50 nm, and the LEE increase-decrease rates due to the difference were compared and studied. Example 3 herein confirmed in detail the relationship between the thicknesses of the p-GaN contact layer 3 and the transparent p-AlGaN contact layer 4 and the effect of suppressing absorption of light by the p-GaN contact layer 3 due to the introduction of the photonic crystal periodic structure (i.e., the reflection effect of the photonic crystal periodic structure). In the deep ultraviolet LED structure shown in the following table (Table 8), the thickness of the p-GaN contact layer 3 was changed in increments of 10 nm in the range of 200 to 300 nm, and the LEE increase-decrease rates due to the difference were compared and studied (Table 9). Herein, the photonic crystal periodic structure 110 that penetrates all layers of from the Al reflecting electrode layer 1 to the transparent p-AlGaN contact layer 4 was formed by setting the parameters of the photonic crystal periodic structure such that the order m of the Bragg scattering conditions is 4, the radius R of the circular hole is 119.5 nm, the period a is 298 nm, and the depth h is 460 nm. It should be noted that (Table 9) also shows as a reference the result of the LEE increase-decrease rate when, for the p-GaN contact layer 3 in the thickness range of 0 to 200, the combination of the thicknesses of the p-GaN contact layer 3 and the transparent p-AlGaN contact layer 4 confirmed in Example 1 is set to 50 nm.

TABLE 8

| 280 nm | | Al Content [%] | Dope | Thickness [nm] | Refractive Index | Extinction Coefficient |
|---|---|---|---|---|---|---|
| Al Electrode Layer | Reflect 90% | | | 150 | 0.246 | 3.401 |
| Ni Layer | Absorb | | | 10 | 1.681 | 2.067 |
| p-GaN Contact Layer | Absorb | | | 260 | 2.76 | 0.75 |
| Transparent p-AlGaN Contact Layer | Transmit 95% or More | 50 | Mg | 40 | 2.65 | |
| p-AlGaN Layer | | 60 | Mg | 20 | 2.56 | |
| Electron Blocking Layer | | 95 | Mg | 20 | 2.28 | |
| Barrier Layer | | 60 | | 10 | 2.56 | |
| Well Layer | | 40 | | 10 | 2.77 | |
| Barrier Layer | | 60 | | 10 | 2.56 | |
| n-AlGaN Buffer Layer | | 60 | Si | 200 | 2.56 | |
| AlN Buffer Layer | | | | 500 | 2.24 | |
| Sapphire Substrate | | | | 1500 | 1.82 | |

TABLE 9

LEE Rate of Change [%] (PhC, Order m: 4)

| P-GaN Contact Layer/ Transparent p-AlGaN Contact Layer | 460 nm (Penetrate) (Front Surface Output) | 460 nm (Penetrate) (Side Surface Output) | 460 nm (Penetrate) (Total Output) |
|---|---|---|---|
| 0/300 nm | | | |
| 50/250 | 112% | 0 | 19% |
| 100/200 | 108 | −1 | 16 |
| 200/100 | 118 | −4 | 12 |
| 210/90 | 111 | −4 | 11 |
| 220/80 | 104 | −4 | 10 |
| 230/70 | 98 | −5 | 8 |
| 240/60 | 95 | −6 | 7 |
| 250/50 | 90 | −8 | 5 |
| 260/40 | 83 | −10 | 2 |
| 270/30 | 75 | −13 | −3 |
| 280/20 | 70 | −18 | −7 |
| 290/10 | 71 | −23 | −11 |
| 300 nm/0 nm | 77 | −30 | −16 |

As shown in Table 9, when the thickness of the p-GaN contact layer is 260 nm (in this case, the thickness of the transparent p-AlGaN contact layer is 40 nm), the LEE rate of change (i.e., total output) is increased by 2%. From the results, it is considered that when the order m of the Bragg scattering conditions as the parameter of the photonic crystal periodic structure is set to 4, it is possible to, by setting the thickness of the p-GaN contact layer 3 to less than or equal to 260 nm (in this case, the thickness of the transparent p-AlGaN contact layer 4 is 40 nm), completely suppress absorption of light by the p-GaN contact layer 3, so that the reflection effect due to the introduction of the reflecting photonic crystal periodic structure appears. As described above, the transparent p-AlGaN contact layer 4 is present, and has a certain thickness.

TABLE 10

LEE Rate of Change [%] (Phc, Order m: 3)

| P-GaN Contact Layer/ Transparent p-AlGaN Contact Layer | 390 nm (Penetrate) (Front Surface Output) | 390 nm (Penetrate) (Side Surface Output) | 390 nm (Penetrate) (Total Output) |
|---|---|---|---|
| 0 nm/300 nm | 94% | 4% | 20% |
| 50/250 | 32 | −9 | −3 |
| 100/200 | 20 | −9 | −6 |
| 150/150 | 8 | −9 | −9 |
| 200/100 | −3 | −18 | −18 |

Further, the relationship between the effect of suppressing absorption of light by the p-GaN contact layer 3 due to the introduction of the reflecting photonic crystal periodic structure and the thicknesses of the p-GaN contact layer 3 and the transparent p-AlGaN contact layer 4 was also compared and studied for a case where the order m of the Bragg scattering conditions as a parameter of the photonic crystal periodic structure was set to 3 (Table 10). In this case, the radius R of the circular hole was set to 89.5 nm, the period a was set to 224 nm, and the depth h was set to 390 nm so as to allow the thickness of only a portion, which penetrates the p-GaN contact layer 3 and the transparent p-AlGaN contact layer 4, of the photonic crystal periodic structure 110 that is formed such that it penetrates all layers of from the Al reflecting electrode layer 1 to the transparent p-AlGaN contact layer 4 to be greater than or equal to the period a as in the case where the order m of the Bragg scattering conditions is set to 4. The thickness of the p-GaN contact layer 3 was changed in increments of 50 nm in the range of 0 to 200 nm.

As is clear from Table 10, even when the order m is 3, it is considered that the advantageous effect of suppressing absorption of light by the p-GaN contact layer 3 due to the introduction of the reflecting photonic crystal periodic structure is expected to be achieved as long as the p-GaN contact layer 3 has a thickness that is less than about 50 nm.

Embodiment 4

The steps of specifically forming the photonic crystal periodic structures described in Examples 1 to 3 above using a nanoimprinting lithography method will be hereinafter described with reference to the drawings. Although an example of the photonic crystal periodic structure 110 shown in FIG. 1E, which is formed such that it penetrates all layers of from the Al reflecting electrode layer 1 to the transparent p-AlGaN contact layer 4, will be described, the basic steps are the same even when the photonic crystal periodic structure 100 that penetrates both the p-GaN contact layer 3 and the transparent p-AlGaN contact layer 4 is formed.

First, a mold for accurately reproducing the photonic crystal periodic structure 100 or 110, which has been designed with any of the methods described in Examples 1 to 3, in the plurality of target layers is created. For the mold, a resin mold 200 is desirably used so that it can follow the warp of the substrate and the layers stacked thereon, which would become prominent if the substrate size is increased.

It should be noted that photoresist used in the imprint technology of the nanoimprinting lithography method should have high fluidity so as to closely fill a mold with a fine projection/recess structure pattern. However, the fluidity will cause deterioration of the etching selectivity of the transparent p-AlGaN contact layer 4. Thus, a bi-layer resist method, which can provide both high fluidity and high etching selectivity, is suitable for solving such a problem.

Figure 7:
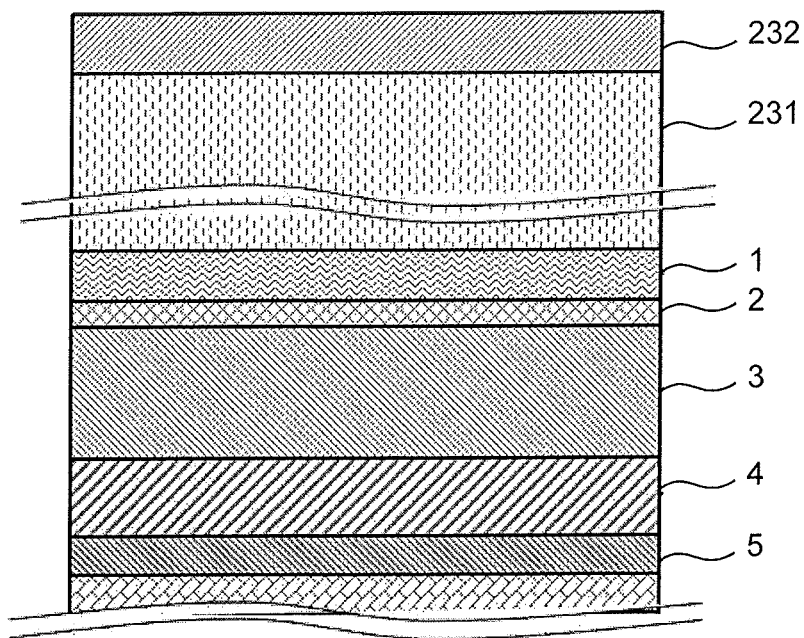
FIG. 7 is a diagram representing a view in which resist is applied using a bi-layer resist method.

Specifically, an organic resist material such as novolac resin, which will improve the etching selectivity of the transparent p-AlGaN contact layer 4, is applied onto the Al reflecting electrode layer 1 by a spin coater or the like for the stacked structure of the deep ultraviolet LED in which layers of up to the Al reflecting electrode layer 1 have been stacked (FIGS. 1A and 1B), whereby an organic resist film 231 is formed. Further, silicon-containing resist with high fluidity is applied onto the organic resist film 231 to form a silicon-containing resist film 232 (FIG. 7). The thickness of the silicon-containing resist film 232 is controlled so as to favorably secure the mold release characteristics of the mold, taking into consideration the viscosity of the material and the like. Typically, the silicon-containing resist film 232 may be thinner than the organic resist film 231.

Figure 8:
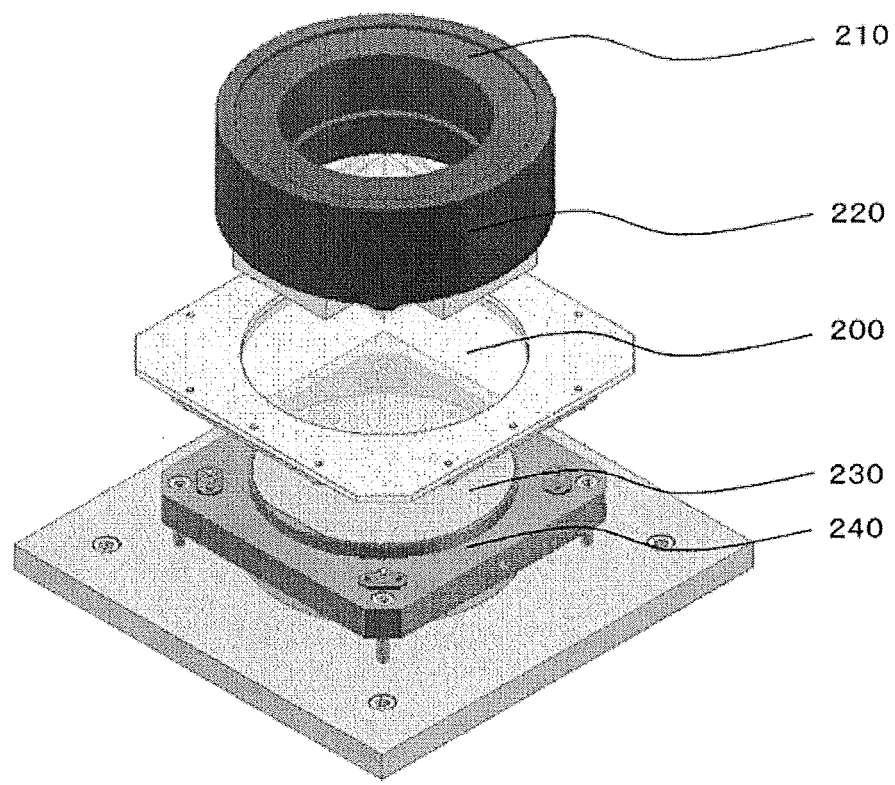
FIG. 8 is a diagram representing a view of pattern imprint performed by a nanoimprinting lithography method using a resin mold.
Figure 9:
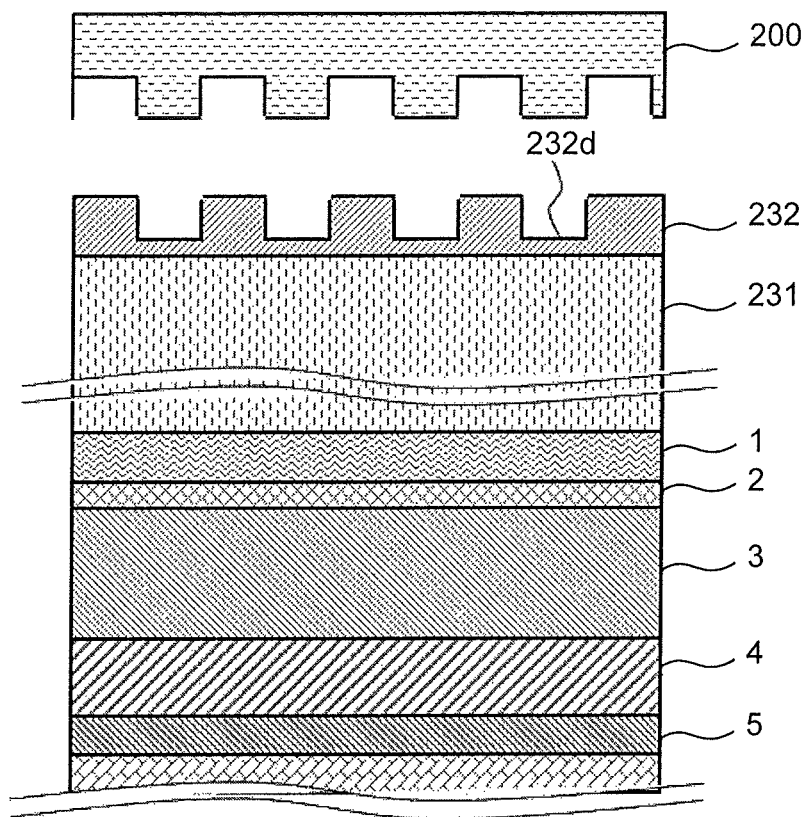
FIG. 9 is a diagram representing a view in which a pattern of a mold is imprinted to resist using a nanoimprinting lithography method.

The photonic crystal periodic structure 100 or 110 designed in accordance with any of Examples 1 to 3 is imprinted to the silicon-containing resist film 232 using the resin mold 200 with the use of the nanoimprinting lithography method, the basic structure of which is shown in FIG. 8. It should be noted that a silicon-containing resist film 232d remains in the recessed portions of the fine projection/recess structure during imprint (FIG. 9).

Figure 10:
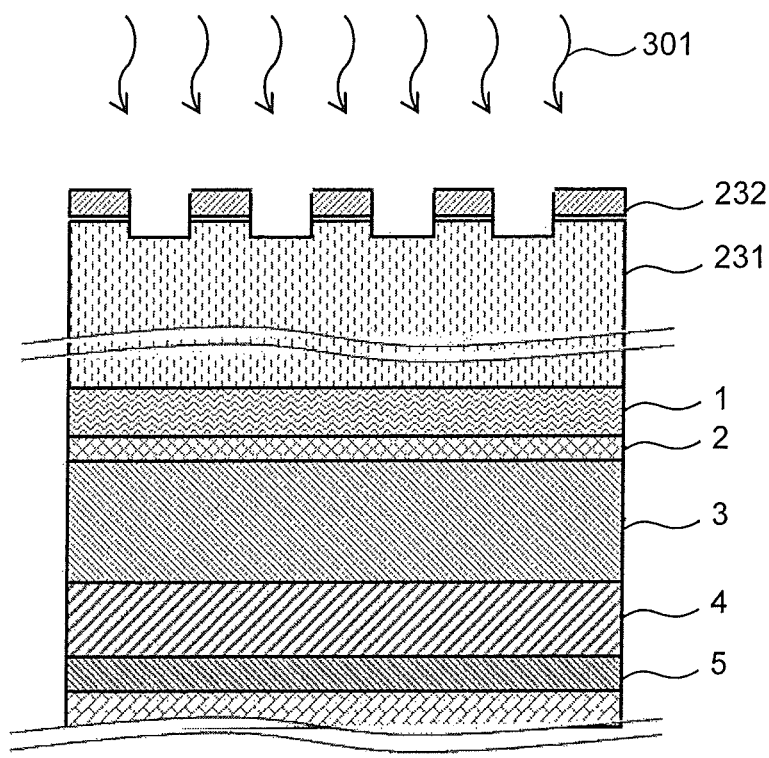
FIG. 10 is a diagram representing a view in which the residual silicon-containing resist is removed by plasma, whereby an organic resist film is exposed.

Next, the silicon-containing resist film 232d that remains in the recessed portions is etched by plasma 301 of oxygen-containing gas and fluorine-containing gas until the organic resist film 231 is exposed. At this time, the projection portions of the silicon-containing resist film 232 are also etched (FIG. 10).

Figure 11:
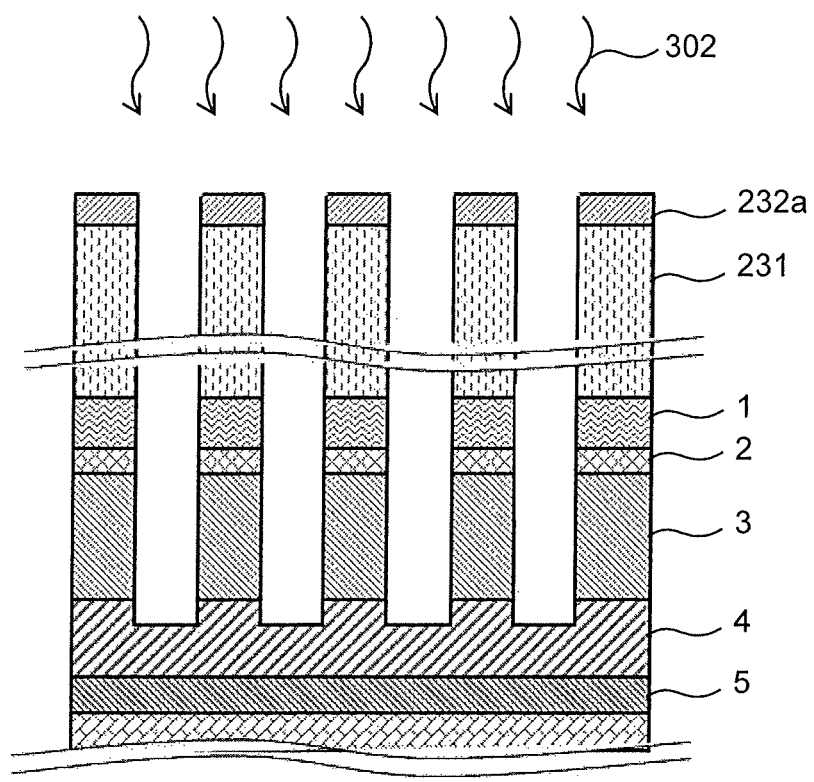
FIG. 11 is a diagram representing a view in which layers of from an Al reflecting electrode are etched at a time by chlorine-containing plasma with a silicon oxide film used as a mask.
Figure 12:
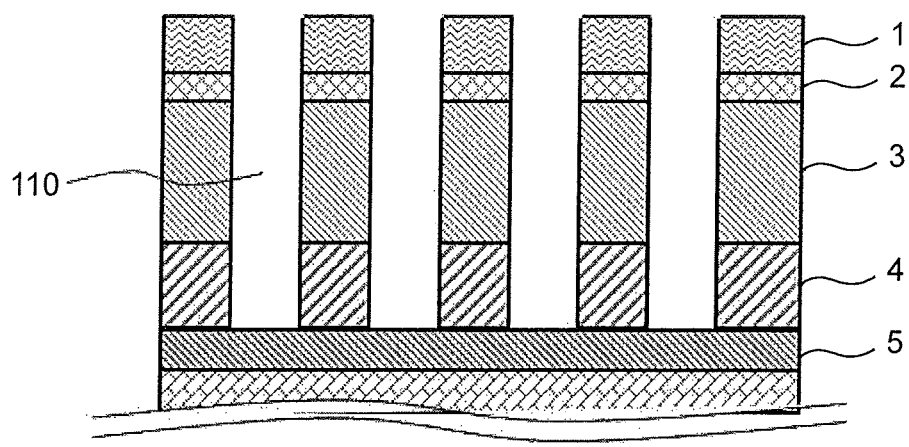
FIG. 12 is a diagram representing a view in which organic resist is removed by ashing, whereby a penetrating photonic crystal periodic structure is formed.

After that, the silicon-containing resist film 232 is exposed to oxygen-containing plasma to form a silicon oxide film 232a, and then, a region of from the Al reflecting electrode layer 1 up to the interface between the transparent p-AlGaN contact layer 4 and the p-AlGaN layer 5 is etched at a time by chlorine-containing plasma 302 with the silicon oxide film 232a used as a mask (FIG. 11). As the chlorine gas, $Cl_2$, BCl, or the like is used. Using the chlorine-containing plasma 302 can secure high selectivity of the transparent p-AlGaN contact layer 4 with respect to the mask. Thus, high-accuracy processing with a high aspect ratio is possible. Finally, the organic resist film 231 and the silicon oxide film 232a are removed by ashing (FIG. 12).

Although this embodiment has illustrated an example of an AlGaN-based deep ultraviolet LED (Light Emitting Diode), it can also be applied to optical semiconductor light emitting elements made of other materials as long as such light emitting elements have similar structures.

CONCLUSION

1) When the film thickness of the p-GaN contact layer is about 200 nm, it is possible to totally reflect incident light and suppress absorption, and thus improve the total value of the LEE increase-decrease rate by 10% or more as long as the depth of the photonic crystal is greater than or equal to 1 period.

2) In the case of 1), the Ni layer can be formed as thick as about 10 to 30 nm. Thus, it is possible to obtain ohmic contact with the p-GaN contact layer, suppress an increase in the drive voltage, and drastically improve the WPE.

3) In the case of 1), the degree of freedom of selection of the reflecting electrode material is increased.

4) A nanoimprinting method that uses bi-layer resist can create a photonic crystal at a time such that it penetrates layers of from a reflecting electrode to a p-GaN contact layer. Thus, as it is not necessary to perform high-precision positioning such as a liftoff process for fine patterns, there is a significant advantage in the production cost.

A process, such as simulation, and control can be implemented by software processing with a CPU (Central Processing Unit) or a GPU (Graphics Processing Unit) or by hardware processing with an ASIC (Application Specific Integrated Circuit) or a FPGA (Field Programmable Gate Array).

In the aforementioned embodiments, structures and the like that are shown in the attached drawings are not limited thereto, and can be changed appropriately within the range in which the advantageous effects of the present invention can be achieved. Besides, such structures and the like can be implemented by being changed appropriately within the scope of the objects of the present invention.

Each component of the present invention can be freely selected, and an invention with a freely selected structure is also included in the present invention.

It is also possible to record a program for implementing the function described in this embodiment on a computer-readable recording medium, and cause a computer system to read the program recorded on the recording medium and execute the program so as to perform a process of each unit. It should be noted that the "computer system" herein includes an OS and hardware of peripheral devices and the like.

In addition, the "computer system" also includes a website providing environment (or displaying environment) if the system uses a www system.

The "computer-readable recording medium" means a portable medium such as a flexible disk, a magneto-optical disk, ROM, or CD-ROM; or a storage device such as a hard disk incorporated in a computer system. Further, the "computer-readable recording medium" also includes a medium that dynamically holds a program for a short period of time, such as a communication line for transmitting a program via a network like the Internet or a communication line like a telephone line, and a medium that holds a program for a given period of time, like a volatile memory in a computer system that serves as a server or a client in the that case. Alternatively, the program may implement some of the aforementioned functions, and may further implement the aforementioned functions by being combined with a program that is already recorded in the computer system. At least some of the functions may be implemented by hardware such as an integrated circuit.

INDUSTRIAL APPLICABILITY

The present invention is applicable to deep ultraviolet LEDs.

REFERENCE SIGNS LIST

1 Al (or Au) reflecting electrode layer
2 Ni (or Pd) layer
3 p-GaN contact layer 4 Transparent p-AlGaN contact layer
5 p-AlGaN layer
6 Electron blocking layer
7 Barrier layer
8 Quantum well layer
9 Barrier layer
10 n-AlGaN layer
11 MN buffer layer
12 Sapphire substrate
100 Photonic crystal periodic structure
110 Photonic crystal periodic structure
200 Resin mold
210 UV light source
220 High tracking mechanism
230 Photoresist
231 Organic resist film
232 Silicon-containing resist film
240 High-rigidity/high-precision stage
301 Plasma of oxygen-containing gas and fluorine-containing gas
302 Chlorine-containing plasma All publications, patents, and patent applications that are cited in this specification are all incorporated by reference into this specification.

The invention claimed is:

1. A deep ultraviolet LED with a design wavelength of $\lambda$, comprising:
 a reflecting electrode layer, a metal layer, a p-type GaN contact layer, and a p-type AlGaN layer that are sequentially stacked from a side opposite to a substrate, the p-type AlGaN layer being transparent to light with the wavelength of $\lambda$; and
 a reflective-type photonic crystal periodic structure with a plurality of holes having a radius of R provided within the p-type AlGaN layer, and also in a range including at least an interface between the p-type GaN contact layer and the p-type AlGaN layer in a thickness direction to the substrate,
 wherein the reflective-type photonic crystal periodic structure has a photonic band gap open to TE polarized components, and satisfies Bragg scattering conditions ($m \times \lambda / n_{av} = 2a$), with m being in a range of $1 < m < 5$, the wavelength $\lambda$, a period a, and an average refractive index $n_{av}$ of the reflective-type photonic crystal periodic structure, wherein R/a includes a value with a maximum photonic band gap, and a depth h of the holes is greater than or equal to the period a.

2. The deep ultraviolet LED according to claim 1, wherein the reflective-type photonic crystal periodic structure is provided in the reflecting electrode layer and the metal layer.

3. The deep ultraviolet LED according to claim 1, wherein the depth h of the photonic crystal periodic structure is greater than or equal to a thickness of the p-type AlGaN layer, and is less than or equal to a total thickness of the p-type GaN contact layer and the p-type AlGaN layer.

4. The deep ultraviolet LED according to claim 1, further comprising, in addition to the p-type AlGaN layer, another p-type AlGaN layer on the substrate side, the other p-type AlGaN layer having a higher Al content than the p-type AlGaN layer.

5. The deep ultraviolet LED according to claim 1, wherein the reflective-type photonic crystal periodic structure is formed using an imprint technology of a nanoimprinting lithography method.

6. The deep ultraviolet LED according to claim 5, wherein the reflective-type photonic crystal periodic structure is formed by dry etching using a bi-layer resist method that uses resist with high fluidity and resist with high etching selectivity.

7. A method for manufacturing a deep ultraviolet LED, comprising:
 preparing a substrate and a stacked structure with a design wavelength of $\lambda$, the stacked structure including a reflecting electrode layer, a metal layer, a p-type GaN contact layer, and a p-type AlGaN layer that are sequentially stacked from a side opposite to the substrate towards the substrate, the p-type AlGaN layer being transparent to light with the wavelength of $\lambda$;
 preparing a mold;
 forming a resist layer on the stacked structure and imprinting a structure of the mold to the resist layer; and
 forming a reflective-type photonic crystal periodic structure by sequentially etching the stacked structure with the resist layer as a mask to form the reflective-type photonic crystal periodic structure within the p-type AlGaN layer, and also in a range including at least an interface between the p-type GaN contact layer and the p-type AlGaN layer along a thickness direction to the substrate,
 wherein the reflective-type photonic crystal periodic structure is formed to have a photonic band gap open to TE polarized components, and to satisfy Bragg scattering conditions ($m \times \lambda / n_{av} = 2a$), with m being in a range of $1 < m < 5$, the wavelength $\lambda$, a period a, and an average refractive index $n_{av}$ of the p-type AlGaN layer and air in the holes, wherein R/a includes a value with a maximum photonic band gap, and a depth h of the holes is greater than or equal to the period a.

8. The method for manufacturing a deep ultraviolet LED according to claim 7,
 wherein the step of forming the resist layer on the stacked structure and imprinting the structure of the mold to the resist layer comprises:
 dry etching the stacked structure with a bi-layer resist having a first resist layer with high fluidity and a second resist layer with high etching selectivity with respect to the first resist layer, and
 imprinting the structure of the mold to the first resist layer by nanoimprinting lithography, and
 wherein the step of forming the reflective-type photonic crystal periodic structure by sequentially etching the stacked structure with the resist layer as a mask comprises:
 etching the first resist layer and the second resist layer until the second resist layer is exposed, and also etching a pattern projection portion of the first resist layer, and
 sequentially etching the stacked structure with the second resist layer as a mask.

* * * * *